US010140395B2

(12) United States Patent
Montana et al.

(10) Patent No.: US 10,140,395 B2
(45) Date of Patent: Nov. 27, 2018

(54) DETECTING COLLISIONS IN A SIMULATED MACHINING OF A WORKPIECE REPRESENTED BY DEXELS

(71) Applicant: Dassault Systemes, Velizy Villacoublay (FR)

(72) Inventors: Nicolas Montana, Venelles (FR); Romain Nosenzo, Aix en Provence (FR)

(73) Assignee: Dassault Systemes, Velizy Villacoublay (FR)

( * ) Notice: Subject to any disclaimer, the term of this patent is extended or adjusted under 35 U.S.C. 154(b) by 333 days.

(21) Appl. No.: 14/954,820

(22) Filed: Nov. 30, 2015

(65) Prior Publication Data
US 2016/0188770 A1    Jun. 30, 2016

(30) Foreign Application Priority Data
Dec. 31, 2014  (EP) .................... 14307225

(51) Int. Cl.
*G06F 17/50* (2006.01)
*G05B 19/4097* (2006.01)
*G05B 19/4069* (2006.01)

(52) U.S. Cl.
CPC ..... *G06F 17/5009* (2013.01); *G05B 19/4069* (2013.01); *G05B 19/4097* (2013.01); *G05B 2219/35346* (2013.01); *G05B 2219/40091* (2013.01); *Y02T 10/82* (2013.01)

(58) Field of Classification Search
CPC ...... G06F 17/5009; G05B 2219/35346; G05B 2219/40091; G05B 19/4069; Y02T 10/82
See application file for complete search history.

(56) References Cited

U.S. PATENT DOCUMENTS

| 4,833,617 A | 5/1989 | Wang et al. |
| 5,710,709 A | 1/1998 | Oliver et al. |
| 6,311,100 B1 | 10/2001 | Sarma et al. |
| 7,747,418 B2 | 6/2010 | Leu et al. |

(Continued)

FOREIGN PATENT DOCUMENTS

| WO | WO 2010/082378 A1 | 7/2010 |
| WO | WO 2011/042764 A1 | 4/2011 |

OTHER PUBLICATIONS

"ATI Stream Computing OpenCL™ Programming Guide," ATI Stream Computing Programming Guide, *Advanced Micro Devices, Inc.*, *p. 4-37*, Jun. 1, 2010.

(Continued)

*Primary Examiner* — Phuc Dang
(74) *Attorney, Agent, or Firm* — Hamilton, Brook, Smith & Reynolds, P.C.

(57) ABSTRACT

It is provided a computer-implemented method for simulating the machining of a workpiece with a cutting tool having at least one cutting part and at least one non-cutting part. The method comprises providing a set of dexels that represents the workpiece, a trajectory of the cutting tool, and a set of meshes each representing a respective cutting part or non-cutting part of the cutting tool. And then the method comprises for each dexel computing, for each mesh, the extremity points of all polylines that describe a time diagram, and testing a collision of the cutting tool with the workpiece along the dexel based on the lower envelope of the set of all polylines.
Such a method improves the simulating of the machining of a workpiece.

16 Claims, 16 Drawing Sheets

(56) References Cited

U.S. PATENT DOCUMENTS

| | | |
|---|---|---|
| 7,832,968 B2 | 11/2010 | Glaesser |
| 8,538,574 B2 | 9/2013 | Hahn |
| 9,117,300 B2 | 8/2015 | Montana et al. |
| 9,524,583 B2 | 12/2016 | Montana et al. |
| 2001/0048857 A1 | 12/2001 | Koch et al. |
| 2002/0133264 A1 | 9/2002 | Maiteh et al. |
| 2003/0083773 A1 | 5/2003 | Schwanecke et al. |
| 2005/0113963 A1 | 5/2005 | Cho et al. |
| 2006/0094951 A1 | 5/2006 | Dean et al. |
| 2009/0148251 A1 | 6/2009 | Glasser et al. |
| 2010/0298967 A1 | 11/2010 | Frisken et al. |
| 2012/0089247 A1 | 4/2012 | Kawauchi et al. |
| 2012/0221300 A1 | 8/2012 | Tukora |
| 2012/0030620 A1 | 12/2012 | Sullivan et al. |
| 2013/0030781 A1 | 1/2013 | Yoneda et al. |
| 2013/0116983 A1 | 5/2013 | Montana et al. |
| 2013/0116984 A1 | 5/2013 | Montana et al. |
| 2013/0116990 A1 | 5/2013 | Montana et al. |

OTHER PUBLICATIONS

Albert, M., An Overview of 3 + 2 Machining, Oct. 4, 2006 http://www.mmsonline.com/articles/an-overview-of-3-2-machining.
Bouma, W. and Vanecek, G., "Collision detection and analysis in a physically based simulation", Proceedings Eurographics workshop on animation.
CAMWorks, http://www.camworks.com/modules/multiaxismachining/.
Dautry, R. and Lions, J-L, "Mathematical Analysis and Numerical Methods for Science and Technology, vol. 4, Intergral Equations and Numerical Methods," Springer, eds., pp. 173-240.
European Search Report for European Application No. EP 11 30 6422; Date of Completion of Search: May 11, 2012.
European Search Report for European Application No. EP 11 30 6423; Date of Completion of Search: Jun. 19, 2012.
European Search Report for European Application No. EP 11 30 6424; Date of Completion of Search: May 24, 2012.
Gottschalk, S., et al., "OBBTree: A Hierarchical Structure for Rapid Interference Detection," Dept. of Computer Science, University, of North Carolina http://www.cs.unc.edu/~geom/OBB/OBBT.html.
Hoffmann, C. M., "Geometric and Solid Modeling", San Mateo, California (1989).
Hopkins, B., "Benefits of Positional Five-Axis Machining" (May 1, 2007). http://www.moldmakingtechnology.com/articles/benefits-ofpositional-five-axis-machining.
http:/www.cs.tau.ac.il/~haimk/seminar09b/Lower Envelopes.pptx.
Huang, Y. et al., "NC Milling Error Assessment and Tool Path Correction," Proceedings of the 21st Annual Conference on Computer Graphics and Interactive Techniques, 1994.
Ilushin, O. et al., "Precise Global Collision Detection IN Multi-Axis NC-Machining," *Computer-Aided Design*, 37: 909-920 (2005).
Jimenez, P. et al., "3D Collision Detection: A Survey," *Computer & Graphics*, 25(2): 269-285 (Apr. 1, 2001).
Kadir, A. A., et al., "Virtual Machine Tools and Virtual Machining—A Technical Review," *Robotics and Computer Integrated Manufacturing*, 27: 494-508 (2011).
Konig, A. H. et al., "Real Time Simulation and Visualization of NC Milling Processes for Inhomogeneous Materials on Low-End Graphics Hardware", http://user.engineering.uiowa.edu/-amalek/sweep/, 1999, 15 pages.
König, A. H. et al., "Real Time Simulation and Visualization of NC Milling Processes for Inhomogeneous Materials on Low-End Graphics Hardware," IEEE Proceedings, Hannover, Germany, pp. 338-349 (Jun. 22-26, 1998).
Lagae, A. and Dutre, P., "Time and space efficient grids for ray tracing", *CW Reports* (2007).
Lee, S. W. et al. "Complete swept volume generation, Part 1: Swept volume of a piecewise $C^1$—continuous cutter at five-axis milling via Gauss map," *Computer Aided Design*, 43: 427-441 (2011).
Lin, M. and Gottschalk, S., "Collision detection between geometric models: A survey," Proc. of IMA Conference on Mathematics of Surfaces, 20 pages (1998).
Liu, S. Q. et al., "Real-Time, Dynamic Level-of-Detail Management for Three-Axis NC Milling Simulation," *Computer-Aided Design*, 38(4): 378-391 (Apr. 2006).
Mayr, H. et al., "A Solid Modeler for Dynamic Objects Using the Dexel Representation," Proceeding of ICED '91, International Conference on Engineering Design, Zurich, Switzerland, pp. 1082-1085 (Aug. 27, 1991).
MoldMaking Technology, Case Study "Five-Axis CAD/CAM Integration Helps Optimize Moldmaker's Machine Utilization" (Apr. 1, 2011), Retrieved from Internet URL: http://www.moldmakingtechnology.com/articles/five-axis-cadcam-integration-helps-optimize-moldmakers-machine-utilization.
Muller, H. et al., "Online Sculpting and Visualization of Multi-Dexel Volumes," SM '03 Proceedings of the 8th ACM Symposium on Solid Modeling and Applications (Jun. 16-20, 2003).
Open GL GUI, Archived Wiki definition dated Jul. 27, 2010. Retrieved from Internet URL: http://gigi.sourceforge.net.
Peng, X. et al., "A Virtual Sculpting System Based on Triple Dexel Models with Haptics," *Computer-Aided Design and Applications*, 6(5): 645-659 (Jan. 1, 2009).
Peng, X., 3 Interactive Solid Modelling in a Virtual Environment with Haptic Interface, Virtual and Augmented Reality Applications in Manufacturing, Springer-Verlag, London (2004).
Peternell, M. et al., "Swept Volumes", *Computer Aided Design & Applications*, 2(5): 599-608 (2005).
Qin, Zhang, et al., "Improvement of collision-detection algorithm based on OBB," J. Huazhong Univ. of Sci. & Tech. (Nature Science Edition) 31:1 (Jan. 2003).
Ren, Y. et al., "Virtual Prototyping and Manufacturing Planning by Using Tri-Dexel Models and Haptic Force Feedback," *Virtual and Physical Prototyping*, 1(1): 3-18 (Mar. 2006).
Shewchuk, J. R., "Adaptive Precision Floating-Point Arithmetic and Fast Robust Geometric Predicates" Discrete & Computational Geometry, 18(3): 305-363 (Oct. 1997).
Stiffer, S., "Simulation of NC Machining Based on the Dexel Model: A Critical Analysis," *Int. J. Adv. Manuf. Technol.*, 10: 149-157 (1995).
Su, C.-J. et al., "A new collision detection method for CSG-represented objects in virtual manufacturing," Computers in Industry, 40(1): 1-13 (Sep. 1999).
Tang, T. D. et al., "The Sweep Plane Algorithm for Global Collision Detection with Workpiece Geometry Update for Five-Axis NC Machining," *Computer Aided Design*, 39: 1012-1024 (2007).
Tukora, B. et al., "Fully GPU-based Volume Representation and Material Removal Simulation of Free-Form Objects," Innovative Developments in Design and Manufacturing Advanced Research in Virtual and Rapid Prototyping—Proceedings of VR, pp. 609-614 (Jan. 1, 2009).
Tukora, B. et al., "GPGPU-Based Material Removal Simulation and Cutting Force Estimation," Proceedings of the Seventh International Conference on Engineering Computational Technology, 16 pages (1994).
Tukora, B. et al., "Multi-Dexel based Material Removal Simulation and Cutting Force Prediction with the Use of General-Purpose Graphics Processing Units," *Advances in Engineering Software*, 43(1): 65-70 (Aug. 16, 2011).
Van Den Bergen, G., "Efficient Collision Detection of Complex Deformable Models using AABB Trees," Dept. of Mathematics and Computing Science, Eindhoven University of Technology (Nov. 6, 1998).
Van Hook., T., "Real-Time Shaded NC Milling Display," SIGGRAPH, 20(4)15-20 (1986).
Wang, C. C. L. et al., "Layered Depth-Normal Images: A Sparse Implicit Representation of Solid Models," Proceedings of ASME International Design Engineering Technical Conferences, Brooklyn, NY.
Wang, W. P., "Geometric Modeling for Swept Volume of Moving Solids," IEEE, 1986 Van Hook, T., Real-Time Shaded NC Milling Display, SIGGRAPH 1986, vol. 20, No. 4, 1986.

(56) References Cited

OTHER PUBLICATIONS

Wright, P. K., et al. "Tool Path Generation for Finish Machining of Freeform Surfaces in the Cybercut Process Planning Pipeline," Laboratory for Manufacturing and Sustainability (University of California, Berkeley) (2007) http://respositories.cdlib.org/lma/codef/wright_04_01.

Zalewski, M., "Guerrilla Guide to CNC Machining," vol. 1: Basic Theory and Preparations, http://diyhpl.us/-bryan/papers2/guerrilla_cnc1.html.

Zhao, H. et al., "Parallel and efficient Boolean on polygonal solids," The Visual Computer, 27.6-8: 507-517 (2011).

Yuksek, Kemal, et al., "A new contour reconstruction approach from dexel data in virtual sculpting." Geometric Modeling and Imaging, 2008. GMAI 2008. 3rd International Conference on IEEE, 2008.

DETECTING COLLISIONS IN A SIMULATED MACHINING OF A WORKPIECE REPRESENTED BY DEXELS

RELATED APPLICATION

This application claims priority under 35 U.S.C. § 119 or 365 to European Application No. 14307225.4, filed Dec. 31, 2014. The entire teachings of the above application(s) are incorporated herein by reference.

FIELD OF THE INVENTION

The invention relates to the field of computer programs and systems, and more specifically to a method, system and program for simulating the machining of a workpiece.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by DASSAULT SYSTEMES (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Some of these systems allow the representation of a modeled volume with a set of dexels. Several papers or patent documents notably suggest using dexel representation for machining simulation or interactive sculpting.

Examples of such documents are:

the paper entitled "*A Virtual Sculpting System Based on Triple Dexel Models with Haptics*", Xiaobo Peng and Weihan Zhang, Computer-Aided Design and Applications, 2009;

the paper entitled "*NC Milling Error Assessment and Tool Path Correction*", Yunching Huang and James H. Oliver, Proceedings of the 21st annual conference on Computer graphics and interactive techniques, 1994;

"*Online Sculpting and Visualization of Multi-Dexel Volumes*", Heinrich Muller, Tobias Surmann, Marc Stautner, Frank Albersmann, Klaus Weinert, SM '03 Proceedings of the eighth ACM symposium on Solid modeling and applications;

the paper entitled "*Virtual prototyping and manufacturing planning by using tri-dexel models and haptic force feedback*", Yongfu Ren, Susana K. Lai-Yuen and Yuan-Shin Lee, Virtual and Physical Prototyping, 2006;

the paper entitled "*Simulation of NC machining based on the dexel model: A critical analysis*", Sabine Stifter, The International Journal of Advanced Manufacturing Technology, 1995;

the paper entitled "*Real time simulation and visualization of NC milling processes for inhomogeneous materials on low-end graphics hardware*", Konig, A. H. and Grolier, E., Computer Graphics International, 1998. Proceedings;

U.S. Pat. No. 5,710,709; and

U.S. Pat. No. 7,747,418.

GPGPU (General-Purpose computing on Graphics Processing Units) is the technique of using a graphic processing unit (GPU) which typically handles computation only for computer graphics, to perform computation in applications traditionally handled by the central processing unit (CPU). Some papers consider using the computation power of modern graphics processing units (GPU) for dexel representation. These papers make use of the LDNI (Layered Depth-Normal Images) algorithm, which is associated to a specific memory model.

Examples of such papers are:

the paper entitled "*GPGPU-based Material Removal Simulation and Cutting Force Estimation*", B. Tukora and T. Szalay, CCP: 94: Proceedings Of The Seventh International Conference On Engineering Computational Technology;

the paper entitled "*Layered Depth-Normal Images: a Sparse Implicit Representation of Solid Models*", Charlie C. L. Wang and Yong Chen, Proceedings of ASME international design engineering technical conferences. Brooklyn (N.Y.).

Algorithms for collision detection in general may describe collision in the case of n moving bodies for example. For polygonal representations, many collision detection methods are based on classical geometrical objects such as Binary Space Partitions or Oriented Bounding Volumes. Several algorithms exist for solids represented by CSG. The CSG structure describes a 3D closed solid as the result of a sequence of Boolean operations performed on simple primitives. Finally, solids may be represented by parametric or implicit equations. These representations have led to many algorithms for testing intersection between surfaces, thus detecting collision. These approaches can be gathered into several groups such as analytic method, lattices method, tracing method, implicit equations.

Examples of papers are:

"*Collision detection between geometric models: A survey*", Lin, M. and Gottschalk, S., Proc. of IMA Conference on Mathematics of Surfaces, 1998;

"*Improvement of collision-detection algorithm based on OBB*", Journal of Huazhong University of Science and Technology, Zhang Qin, Huang Kun, Li Guangming;

"*Collision detection and analysis in a physically based simulation*", W. Bouma and G. Vanecek, Proceedings Eurographics workshop on animation and simulation, 1991;

"*A new collision detection method for CSG-represented objects in virtual manufacturing*", Chuan-Jun Sub, Fuhua Lina, and LanYeb, Computers in Industry, Volume 40, Issue 1, September 1999, Pages 1-13; and "*Geometric and Solid Modeling*"; C. M. Hoffmann, Morgan Kaufmann, San Mateo, Calif., 1989

Collision detection for NC simulation is however specific. The specificity of machining simulation is two folded. On the one hand, the geometry of the workpiece continuously evolves during the machining process. On the other hand, the moving tool includes cutting parts and non-cutting parts, e.g. respectively the shank (the side of the tool) and the holder. In the context of NC machining simulation, or more general sculpting simulation, quite few authors have considered checking the collision between the non-cutting moving parts and the evolving workpiece.

In the following references, the problem of detecting collision problem is addressed by updating the geometry of the part between each collision test:

"Precise global collision detection in multi-axis NC-machining", Oleg Ilushina, Gershon Elberb, Dan Halperin, Ron Wein, Myung-Soo Kim, Computer-Aided Design 37 (2005) 909-920;

"The sweep plane algorithm for global collision detection with workpiece geometry update for five-axis NC machining", T. D. Tang, Erik L. J. Bohez, Pisut Koomsap, Computer-Aided Design 39 (2007) 1012-1024; and Commercial software CAMWorks (registered trademark).

As can be seen, the history of machining simulation is long. However, the existing solutions lack efficiency, notably from a memory performance point of view, from an accuracy of simulation point of view, and/or from a user utilization point of view.

FIGS. 1-3 illustrate issues that may appear when simulating the machining of a workpiece.

Approaches that only detect collisions at tool positions (this is notably the case of "Precise global collision detection in multi-axis NC-machining", Oleg Ilushina, Gershon Elberb, Dan Halperin, Ron Wein, Myung-Soo Kim, Computer-Aided Design 37 (2005) 909-920, and CAMWorks) perform a collision detection at each tool position. Consequently, what occurred when the tool moves from one position to the next one is ignored. This implies that a collision occurring between two consecutive positions is ignored. To overcome this flaw, the tool trajectory is usually over-discretized so that the distance between two consecutive tool positions never exceeds a given tolerance. This induces a poor performance since a huge number of checks is required. FIG. 1 illustrates a missed collision between the workpiece 10 and the non-cutting part 12 of the tool 14. FIG. 2 illustrates detection of said missed collision 20 between the workpiece 10 and the non-cutting part 12 of the tool 14, thanks to a good enough discretization. It is noted that such discretization is costly (resulting in a lack of—e.g. visual—fluidity of the simulation), and can never be 100% secure.

Several approaches assume that the workpiece remains constant, meaning that the material removal phenomenon is not handled, which is not realistic when dealing with machining process. These approaches belong to a more general class of algorithms detecting collision between two objects that are supposed not to evolve during time. These algorithms are generally used to solve path planning problems. In the context of machining simulation they are used to check that no collision occurs against the designed part. Only gouge can be detected this way.

Few approaches are able to deal with the two previous problems: these approaches generally aim to consider the workpiece as evolving along time, and allow detecting collisions along tool move and not only at tool positions. However, these approaches can be based on restrictive assumptions about the tool geometry, and they can discard some tools that may require a huge (and even infinite) number of convex parts, such as a torus. These approaches can neither handle tools featuring a void, or round-over tool. More generally, these approaches fail to handle tools resulting from Boolean subtraction between convex parts. Approximating such tools by union of convex parts would result in really poor performance and loss of precision. FIG. 3 illustrates a cutting tool 30 including a non-convex cutting part 32 that is able to machine the workpiece 34 without collision with the non-cutting part 36. As can be seen, no collision should be reported because the shape of the cutting tool and its trajectory ensure that the cutting part always encounters workpiece material first. However, these approaches are likely to wrongly report a collision (although they may be performant from other point of views).

Within this context, there is still a need for an improved solution for simulating the machining of a workpiece.

SUMMARY OF THE INVENTION

According to one aspect, it is therefore provided a computer-implemented method for simulating the machining of a workpiece with a cutting tool having at least one cutting part and at least one non-cutting part. The method comprises providing a set of dexels that represents the workpiece, each dexel comprising a set of at least one segment representing the intersection between a line and the workpiece, a trajectory of the cutting tool, the trajectory of the cutting tool being a rigid motion, and a set of meshes each representing a respective cutting part or non-cutting part of the cutting tool. The method then comprises, for each dexel, computing, for each mesh, the extremity points of all polylines that describe a time of intersection between the line of the dexel and the mesh as a function of a height of intersection, according to the trajectory of the cutting tool. And the method comprises testing a collision of the cutting tool with the workpiece along the dexel. The testing includes determining if, for a value of height that corresponds to a position that belongs to the lower envelope of the set of all polylines of all meshes, the polyline to which the position belongs being associated to a non-cutting part, the value of height belongs to a segment of the dexel.

The method may comprise one or more of the following:
    computing the extremity points of all polylines comprises, for each mesh, and for each extremity point of a respective polyline determining, based on all faces of the mesh associated to the respective polyline, the boundary face of a volume swept by a face of the mesh, according to the trajectory of the cutting tool, with which intersection of the line of the dexel corresponds to the extremity point, and computing a time and a height based on the intersection between the line of the dexel and the determined boundary face;
    computing the extremity points of all polylines further comprises, for each mesh, determining a visible part of the mesh, the visible part being the portion of the mesh directed toward the trajectory of the cutting tool, computing the boundary of a volume swept by the visible part, according to the trajectory of the cutting tool, and then iterating, for each extremity point of a respective polyline, the determining of the boundary face of the volume swept by a face of the mesh, with which intersection of the line of the dexel corresponds to the extremity point, and the computing of a time and a height, wherein the determining of the boundary face consists of identifying a respective boundary face of the computed boundary of the volume swept by the visible part;

computing the extremity points of all polylines further comprises, for each mesh, determining adjacency information relative to volumes swept by the faces of the visible part, and for each respective polyline, the determining of the boundary face of the volume swept by a face of the mesh, with which intersection of the line of the dexel corresponds to a first extremity point of the polyline, consists of determining, by geometrical computation, a first face of the computed boundary of the volume swept by the visible part, said first face being intersected by the line of the dexel, and the determining of the boundary face of the volume swept by a face, with which intersection of the line of the dexel corresponds to the second extremity point of the polyline, consists of determining, by topological propagation based on the adjacency information, a second face of the computed boundary of the volume swept by the visible part, said second face being intersected by the line of the dexel; and/or the iterating is parallelized over the set of dexels;

the determining of first faces implements rasterization over the set of dexels.

It is further proposed a data structure (e.g. stored in a file) including specifications of a simulation of the machining of a workpiece with a cutting tool having at least one cutting part and at least one non-cutting part, according to the method.

It is further proposed a system comprising a processor coupled to a memory having recorded thereon instructions for performing the method. The processor may be a massive parallel processing unit. The system may comprise at least one GUI suitable for launching execution of the instructions. The GUI may comprise a GPU and the processor may be the GPU.

It is further proposed a computer program comprising instructions for performing the above method.

It is further proposed a computer readable storage medium having recorded thereon the above computer program.

It is further proposed a method for producing/manufacturing a product. The producing method comprises a simulation phase where the above method for simulating the machining is repeated, and then a machining phase on a workpiece.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where.

DETAILED DESCRIPTION OF THE INVENTION

A description of example embodiments of the invention follows.

The teachings of all patents, published applications and references cited herein are incorporated by reference in their entirety.

Figure 4:
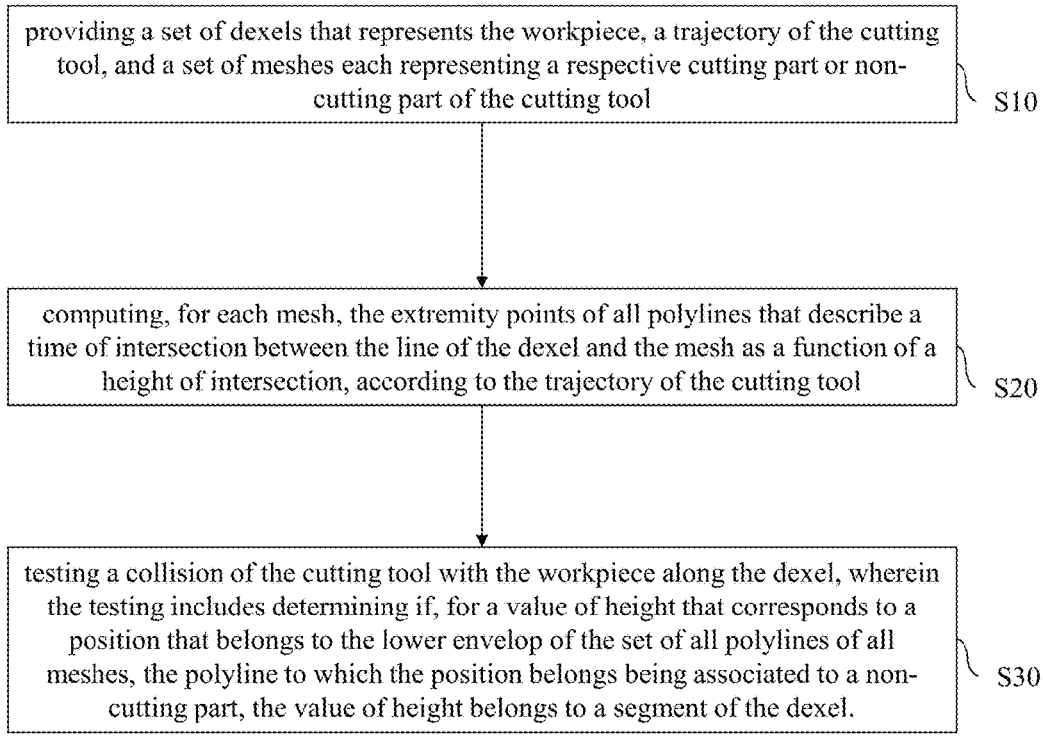
FIG. 4 shows a flowchart of an example of the method.

Referring to FIG. 4, it is provided a computer-implemented method for simulating the machining of a workpiece with a cutting tool. The cutting tool contemplated by the method has at least one cutting part and at least one non-cutting part (also called "clashing part", such that the cutting tool may potentially be a—partly—clashing object). The method comprises providing S10 a set of dexels that represents (in 3D) the workpiece (the set of dexels and/or the workpiece being also referred to as "modeled volume/object" in the following). By definition, each dexel comprises a set of at least one segment representing the intersection between a line and the (e.g. volume occupied by the) workpiece. Here, a dexel corresponds to positions (i.e. the segment(s) of the dexel) on the line where there is material of the workpiece. It is however noted that the term "dexel" may alternatively designate the data associated to all lines of such a 3D model, such that some dexels may be deprived of any material/segments, e.g. from the beginning or by the method. This is a just matter of definition. The data provided at S10 also include (specifications of) a trajectory (in 3D, e.g. non planar, although alternatively the trajectory may be planar, e.g. a sequence of positions in a plane, e.g. a 2,5-axis trajectory) of the cutting tool. In the case of the method, the trajectory of the cutting tool is a rigid motion (without loss of generalization to a more complex trajectory consisting of a series of rigid motions, and a repetition of the method on each of the rigid motions of the series). The data provided at S10 also include a set of meshes. Each mesh represents a respective cutting part or non-cutting part of the cutting tool (the set of meshes thus represents the cutting tool). The method then comprises a specific (e.g. parallel) processing (e.g. with a GPU) for each dexel. This includes computing S20, for each mesh (e.g. the method looping on the set of meshes), the extremity points of all polylines, said polylines describing a time of intersection between the line of the dexel and the mesh (that is, a face—or even an edge or a vertex—of the mesh) as a function of a height of intersection, the computing S20 being performed according to the trajectory of the cutting tool provided at S10. This is followed by testing S30 a collision of the (e.g. sweep of the) cutting tool with the workpiece along the dexel (i.e. responding at least to the question whether the—non-cutting part of the—cutting tool clashes—e.g. intersects at some point in time—with at least one material segment of the dexel, taking into account the evolution of the dexel as cutting parts of the cutting tool update/modify said dexel). In specific, the testing includes determining if, for a value of height that corresponds to a position that belongs to the lower envelope of the set of all polylines of all meshes, the polyline to which the position belongs being associated to a non-cutting part, the value of height belongs to a segment of the dexel (it is thus tested if there exists such value of height). Such a method improves the simulation of the machining of a workpiece.

Notably, the method is directed to the simulation of the machining a workpiece with a cutting tool having at least one cutting part and at least one non-cutting part, the cutting tool undergoing a trajectory (the method does not concern with the speed at which the trajectory is undergone, such that any speed may be contemplated in the computations, for example any constant speed—in terms of distance relative time), and the method detects (S20 and S30) collision of the cutting tool with the workpiece (more specifically, the non-cutting part, thus the clashing part, of the cutting tool). The method thus allows a fine simulation of industrial machining.

Furthermore, the method is based on a dexel representation, and it is thus light in terms of buffering and computations (as dexels form a representation which is both discrete and massively parallelizable). As a consequence, the method is fluid/smooth and thus responsive, which is appreciated on the user end. If the method further displays a representation of the workpiece and a representation of the cutting tool undergoing the trajectory, e.g. altogether with a representation of the machining, then such display is relatively fluid/smooth and uninterrupted. Now, the method further performs the test at S30 based on a specific data, that is, those computed at S20. In specific, the method computes the extremity points of all polylines that describe a time of intersection between the line of the dexel and the mesh as a function of a height of intersection, according to the trajectory of the cutting tool. Again, these data are discrete and the structure of the data contemplated at S20 ensures that the computations may be parallelized over the dexels. The method is thus all the more efficient from a computations, responsiveness, and memory buffering point of view.

Figure 3:
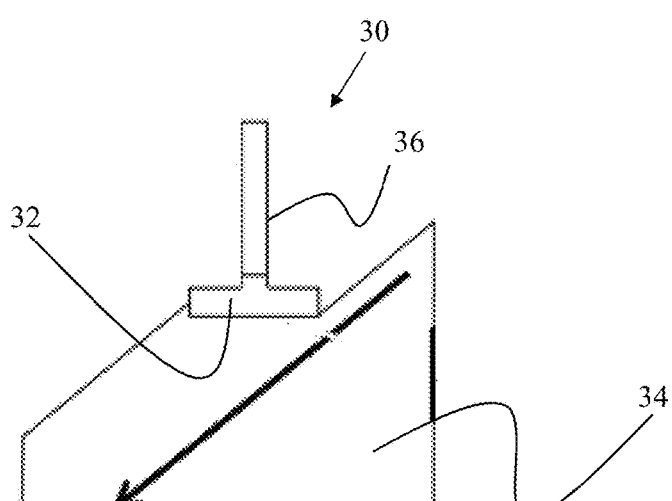

Moreover, the data computed have a specific meaning and they have specific mathematical properties that allow the specific easy and comprehensive (with respect to time as a continuous function, as opposed to earlier-mentioned prior art time-steps-based methods which can be seen as a discrete approach) testing proposed by the method at S30. Indeed, the method amounts to determine a geometrical condition, once the problem is well-written, which makes the method output a correct result and thus a realistic and correct simulation. These mathematical properties will be detailed later. At this point, it is noted that the method is able to handle relatively arbitrary tools (i.e. simulation is correct, e.g. more collisions are correctly reported and/or less collisions are wrongly reported), such that the method works well even for non-convex cutting tools and/or cutting tools having a non-convex cutting part. The cutting tool is not constrained to be solid of revolution (although this is of course possible). The cutting tool may for example feature a void, or be a round-over tool. More generally, the cutting tool may have a shape resulting from Boolean subtraction between convex parts. For example, the method works well in the situation of FIG. 3 (i.e. no collision is wrongly reported), with a reasonably good animation speed. The cutting tool may in examples be a corner rounding end mill, a quarter round tool, a set of milling cutters, or a cutter gang. Also, the mathematics behind the method make it work relatively well in the case of any (series of) rigid motion(s), such that the method is relatively not limited in terms of tool trajectory.

The method thus handles collision detection during tool move, with relatively arbitrary tool representation and/or relatively arbitrary evolution of the workpiece, in a robust, fluid/smooth and comprehensive manner.

The method is computer-implemented. Steps of the method are indeed executed on a computer system, by the computer system alone or by graphical user-interaction (i.e. a user interacting with a GUI of the computer system). Thus, steps performed specifically by the computer system may be performed fully automatically. In examples, the triggering of at least some of the steps of the method may be performed through user-computer interaction. Notably, the providing step S10 is performed by user-interaction, where the user specifies the data provided at S10. S10 may indeed correspond to a user launching a machining simulation. The computing S20 and the testing S30 may then be performed automatically. The level of user-computer interaction required may depend on the level of automatism foreseen and put in balance with the need to implement the user's wishes. In examples, this level may be user-defined and/or pre-defined.

A typical example of computer-implementation of the method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physically distinct parts (e.g. one for the program, and possibly one for the database). The GUI may comprise a GPU. In such a case, the processor may be the GPU. In other words, the processor executing at least steps of the method, in particular the steps of computing S20 and/or testing S30, may be the GPU. Such a system is an efficient tool for simulating a machining. This is particularly true when the workpiece is represented as a set of dexels. Since dexel based algorithms are well suited for massively parallel hardware, it is efficient to consider using the computation power of modern graphic processing unit (GPU).

The method generally manipulates modeled objects. A modeled object is any object defined by data stored in the database. By extension, the expression "modeled object" designates the data itself. The method may be part of a process for designing a modeled object (e.g. the workpiece), e.g. by first defining a workpiece (which may thus be a 3D modeled object) and then simulating the machining of the workpiece according to the method. "Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object, notably by the machining simulated by the method.

According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD system, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing or modeling process.

The 3D modeled object may represent the geometry of a product to be manufactured in the real world subsequent to the completion of its virtual design with for instance a CAD software solution or CAD system, such as a (e.g. mechanical) part or assembly of parts, or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore or transportation. The 3D modeled object designed by the method may thus represent an industrial product which may be a part of a terrestrial vehicle (including e.g. car and light truck equipment, racing cars, motorcycles, truck and motor equipment, trucks and buses, trains), a part of an air vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a mechanical part (including e.g. industrial manufacturing machinery, heavy mobile machinery or equipment, installed equipment, industrial equipment product, fabricated metal product, tire manufacturing product), an electromechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is meant any system adapted for the management of a modeled object representing a physical manufactured product. In a PLM system, a modeled object is thus defined by data suitable for the manufacturing of a physical object. These may typically be dimension values and/or tolerance values. For a correct manufacturing of an object, it is indeed better to have such values.

CAM stands for Computer-Aided Manufacturing. By CAM solution, it is meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process. Such CAM solutions are provided by Dassault Systèmes under the trademark DELMIA®.

CAE stands for Computer-Aided Engineering. By CAE solution, it is meant any solution, software or hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality components from different fields of physics without CAD geometry data. CAE solutions allows the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software or hardware, adapted for managing all types of data related to a particular product, A PDM solution may be used by all actors involved in the lifecycle of a product: primarily engineers but also project managers, finance people, sales people and buyers. A PDM solution is generally based on a product-oriented database. It allows the users to share consistent data on their products and therefore prevents actors from using divergent data. Such PDM solutions are provided by Dassault Systèmes under the trademark ENOVIA®.

Figure 5:
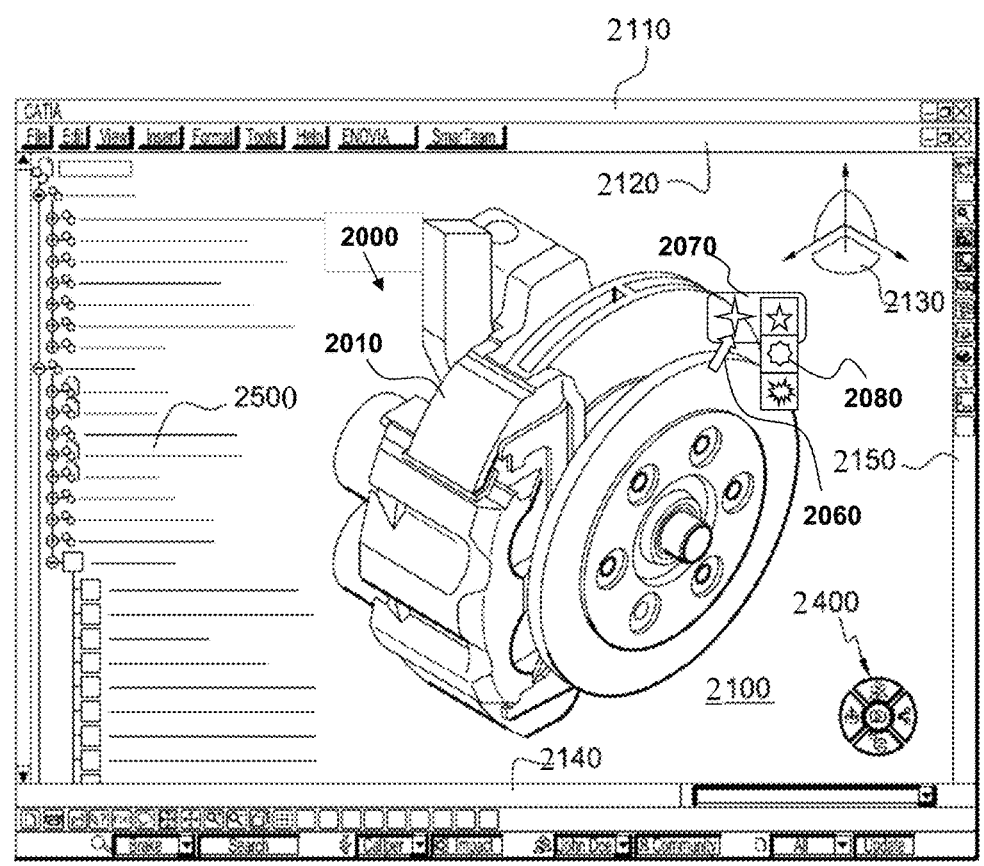
FIG. 5 shows an example of a graphical user interface.

FIG. 5 shows an example of the GUI of the system, wherein the system is a CAD system.

Figure 1:
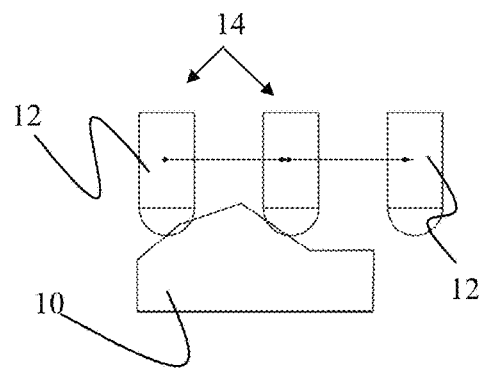
FIGS. 1-3 illustrate main issues in machining simulation.
Figure 2:
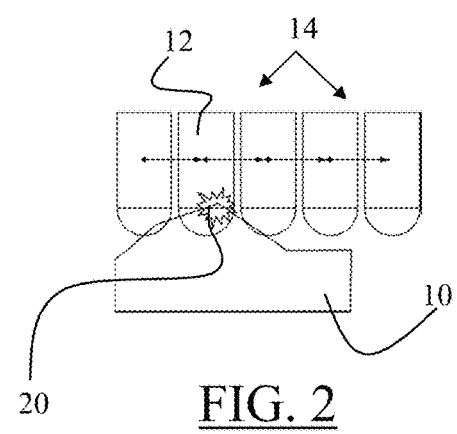

The GUI 2100 may be a typical CAD-like interface, having standard menu bars 2110, 2120, as well as bottom and side toolbars 2140, 2150. Such menu- and toolbars contain a set of user-selectable icons, each icon being associated with one or more operations or functions, as known in the art. Some of these icons are associated with software tools, adapted for editing and/or working on the 3D modeled object 2000 displayed in the GUI 2100, displayed 3D modeled object 2000 being for example the result of performing the method. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. change the dimension, color, etc.) or edit geometrical constraints by selecting an appropriate icon. For example, typical CAD operations are the modeling of the punching or the folding of the 3D modeled object displayed on the screen. The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 6:
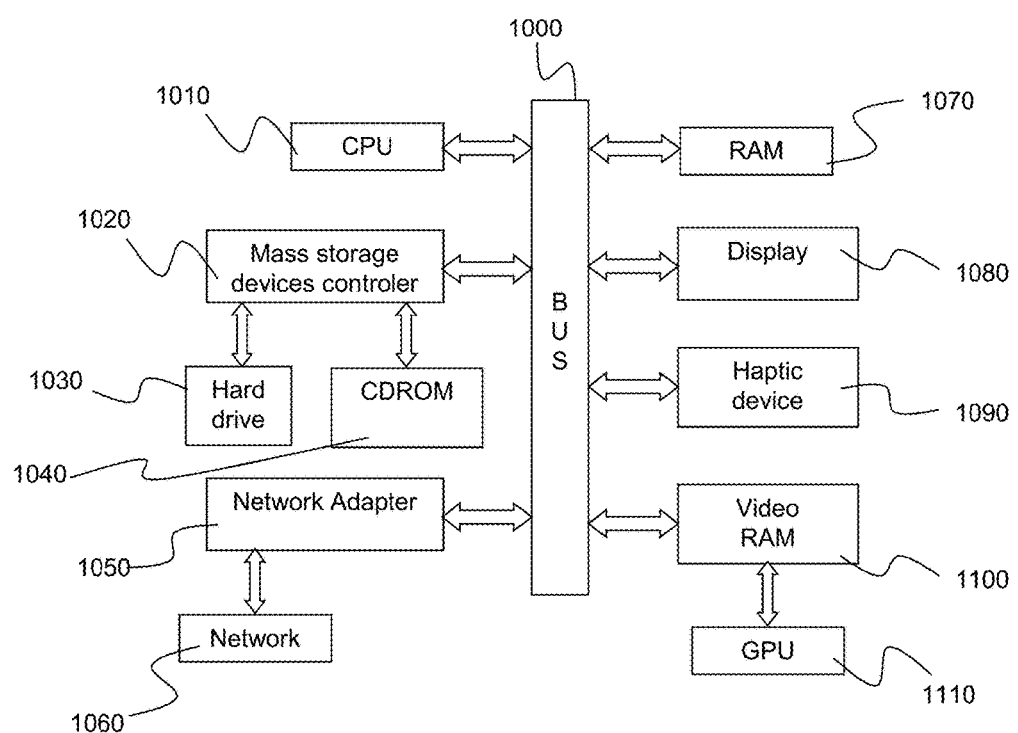
FIG. 6 shows an example of a client computer system.

FIG. 6 shows an example of the system, wherein the system is a client computer system, e.g. a workstation of a user.

The client computer of the example comprises a central processing unit (CPU) 1010 connected to an internal communication BUS 1000, a random access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive/touch pad, and/or a sensitive/touch screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming language, or in assembly or machine language if desired. In any case, the language may be a compiled or interpreted language. The program may be a full installation program or an update program. Application of the program on the system results in any case in instructions for performing the method.

Furthermore, it is noted that the specifications of the method (i.e. data provided at S10, data computed at S20 and results determined at S30) may all be stored, for example in a data file, for later use, e.g. by a third person. Notably, the simulating may be replayed/redisplayed anytime. Also, the simulation may be implemented in a product producing/manufacturing process, e.g. performed based on said data file. Such process may comprise, as known, a simulation phase where a machining simulation is repeated, and then a (real) machining phase on a (real) workpiece, based on the result of the simulations. For example, at each simulation where a collision is detected, the process may repeat a simulation by adjusting the trajectory. It is here noted that the simulation method of FIG. 4 allows the easy computation of the collision depth (a classical data known to be important in the field of machining), and that the trajectory can thus be adjusted with efficiency based on such data. This can be repeated until no collision is detected and/or a satisfying trajectory is determined. Then, a real machining may be performed, reproducing the trajectory of the retained simulation.

The providing S10 is now discussed.

The method comprises providing a set of dexels S10 that represents the modeled volume (of the workpiece). This allows a light representation of the modeled volume (in other words, the modeled volume may be represented using little memory space). This also allows a representation of the modeled volume which may be easily handled. Notably, design operations on the modeled volume may be performed particularly efficiently (e.g. parallelized) when the modeled volume is represented by a set of dexels, due to the data structure of a set of dexels. In other words, this structure allows massively parallel processing. Thus, design operations may be performed with high responsiveness and high robustness.

In the case of the method, the dexel representation is further specifically relied upon at S20 and S30 to perform the collision test. Thus, the method efficiently combines computational advantages of the dexel representation and realistic-ness considerations on the simulation.

The term "dexel" is known to be a shortcut for "depth element" (just as the term "pixel" is a shortcut for "picture element"). The notion of dexel has been mentioned in a large number of research papers. In the context of the method, a dexel comprises a set of at least one segment, i.e. a pair of 3D points. In an example, the modeled volume comprises at least one dexel which comprises a set of at least two segments. The segments of a dexel, if several, may be ordered (in such a case the dexel is a list), or unordered. The segments of a dexel represent the intersection between a line and the modeled volume. In other words, considering virtual lines intersecting with the modeled volume, a dexel is the set of the segments originating from a given line and that results from the computation of the intersection. Providing the set of dexels may thus comprise computing such intersections, e.g. by tracing virtual lines and computing their intersections with the modeled volume, which may be initially represented by a B-Rep or any other volume representation. The set of dexels thus represents the modeled volume (i.e. the workpiece).

It is important to note that the set of dexels is provided at S10 as computer-implemented data. Thus, the definitions provided above and below regarding any representation of the modeled volume have implications from a data structure point of view. For example, a segment may be provided as a pair of 3D positions (e.g. two 3D positions linked to each other), for example as heights on the dexel line, with the geometry of the line being also provided (reference point and direction). A 3D position may also be provided as a list of three coordinates (e.g. floating points), associated to a referential 3D frame. A dexel is a set of segments, which implies that segments are linked together in a set structure. The dexels of a set of dexels may as well be linked together. Representing the workpiece by a set of dexels, which themselves comprise a set of at least one segment, allows a fast updating S30 of the workpiece.

Figure 7:
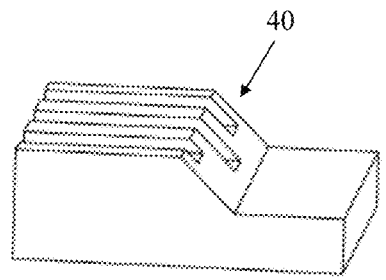
FIGS. 7-42 illustrate the method.
Figure 8:
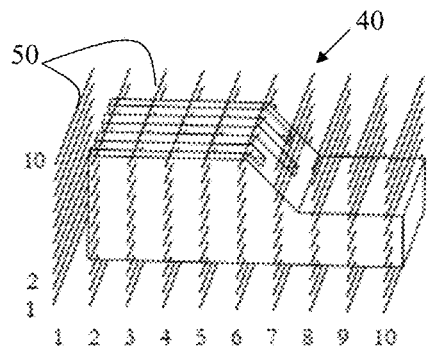

The concept of dexels is now illustrated with reference to FIGS. 7-9 which present an example of the step of providing the set of dexels S10 as a dexel structure 67.

Given a modeled volume and given an infinite line, a dexel is the set of segments (or intervals) representing the intersection between the infinite line and the modeled volume (of the workpiece). This set of segments is captured, in the memory, as a set of boundary points of each segment. For instance, a reference/origin point (a 0—zero—height point) may be defined on each line, and a height (e.g. algebraic value, i.e. negative or positive scalar value, e.g. integer or real, encoded e.g. a floating point or any other adapted data type) on said line may determine a boundary point (being noted that this framework for defining a height may apply to S20, e.g. with the same origin point). A dexel structure is a set of dexels (each comprising a set of segments) which are organized, for example by being ordered on a rectangular grid (e.g. sharing same direction, e.g. the whole structure comprising three grids whose directions are orthogonal two by two). FIGS. 7 and 8 illustrate a modeled volume 40 together with a ten by ten grid of lines 50. The method of the example comprises providing modeled volume 40 (representing a workpiece), e.g. as a B-Rep, as illustrated on FIG. 7. The method of the example then comprises defining a ten by ten grid of lines 50 that intersect (at least partly) modeled volume 40, as illustrated on FIG. 8. The method of the example then comprises computing dexels 65 which comprise sets of segments 60 and/or 62, as represented on FIG. 9. One dexel 65 is circled on the figure. A dexel 65 may comprise several segments 60, or one segment 62, depending on whether the line 50 intersects modeled volume 40 at one spot or at several separate spots. Of course, the method may alternatively retrieve dexels 65 from a memory. In any case, dexel structure 67 is thus provided.

Figure 9:
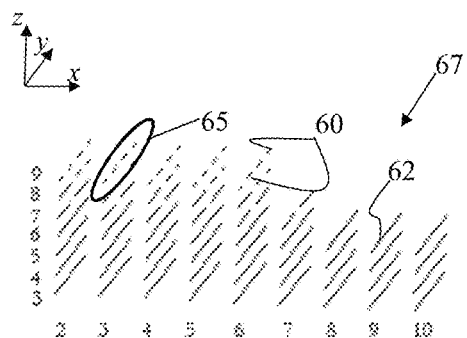

FIG. 9 illustrates the resulting dexel structure 67. It should be noticed that not all the lines 50 intersect modeled volume 40 (only fifty-two lines intersect modeled volume 40 in the example), yielding as many dexels 65 (lines not intersecting modeled volume 40 may indeed be discarded and yield no dexel). Furthermore, some lines 50 intersect modeled volume 40 through one segment 62 (dexel(2,3) or dexel (9,6) for example), others through several segments 60, for example two segments (dexel (7,7) or dexel (4,7) for example), or three segments (dexel (2,8) or dexel (5,8)), or four segments (dexel (2,9) or dexel (4,9)). The resulting dexel structure 67 includes fifty-two dexels 65 including thirty-six dexels 65 with one segment 62, six dexels 65 with two segments 60, five dexels 65 with three segments 60 and five dexels with four segments 60.

The set of dexels provided at S10 may be a tridexel structure. A tridexel structure is defined by comprising three dexel structures, typically a dexel structure parallel to the x-axis, a dexel structure parallel to the y-axis and a dexel structure parallel to the z-axis. The method may comprise displaying a graphical representation of the workpiece at any time, for example during the computing S20 and the testing S30. The displaying may be based on the set of dexels. A tridexel structure provides a good display because it is little "view direction" dependant. A tridexel structure notably provides a more accurate display when the user changes the viewpoint.

Figure 10:
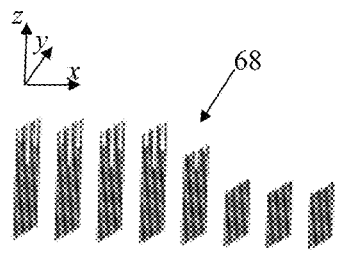
Figure 11:
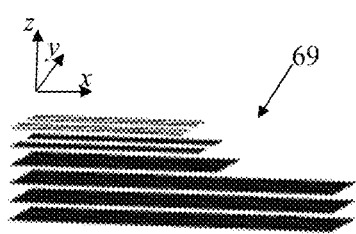
Figure 12:

FIGS. 10-12 each show a dexel structure representing a same modeled volume. In other words, the modeled volume may be defined by tridexel data, comprising the three dexel structures of FIGS. 10-12 (e.g. with orthogonal directions). FIG. 10 shows dexel structure 67, along the y-axis. FIG. 11 shows dexel structure 68, along the x-axis. FIG. 12 shows dexel structure 69, along the z-axis. On each figure, the lines of the dexels are parallel to the respective axis.

The principle of machining simulation for the method is to compute the intersection of each dexel with the swept volume of the tool, and to trim its material interval accordingly. The invention may go one step further by, at least virtually, (1) computing at S20 the intersection with the cutting and non-cutting parts of the tool and by (2) ordering at S30 these intersections according to the time sequence. Then, it is possible to understand if the cutting part meets material before or after the non-cutting part and to report only actual collisions.

The data provided at S10 also include a representation of the cutting tool, in the form of a set of meshes (that correspond to the geometry of the cutting tool). A mesh designates any graph structure, with vertices (3D positions) and edges (e.g. segments) linking vertices two-by-two and forming so-called faces of the mesh (i.e. smallest cycles of edges). The meshes may be one of different types, such as convex faces meshes—e.g. meshes with convex polygon faces—including quad meshes (consisting mainly or fully of four edge—convex—faces) and triangular meshes (consisting mainly or fully of three edge faces), for particularly fast and straightforward computations at S20. In other refined examples, the meshes may have a more complex structure, such as a B-Rep, the term "mesh" being in such case understood in its most general definition.

The tool model (e.g. corresponding to a real-world tool) is defined by a list of adjacent solids, each solid being a cutting part or a non-cutting part. In an example, a mesh is the triangulated boundary of a solid. Consequently, the tool is provided at S10 as a list of closed and non-self-intersecting meshes. Each mesh represents either a cutting part of the tool, or a non-cutting part of the tool. Meshes representing a cutting part may be labeled e.g. "Cutting" and/or meshes representing a non-cutting part may be labeled e.g. "Clashing". The intersection between two meshes of a tool has a null-volume, meaning that two meshes are either separated or that they share faces (or an overlap of faces) modeling a contact area. Any tool geometry can be represented this way by using Boolean polyhedral operations. So, these assumptions do not restrict the generality of the method.

Also provided at S10 is a trajectory of the cutting tool. The method is mainly described for 3-axis trajectories afterwards, but it can be extended to more complex trajectories (e.g. 5-axis). The trajectory may be provided as a polygonal line in the three dimensional space, and each line segment being named an "elementary trajectory" in the following. Along a line segment of a 3-axis trajectory, the tool moves according to a translation. Along a line segment of a 5-axis trajectory, the tool moves according to a translation and, in addition, the axis of the tool changes linearly from the initial orientation to the final orientation. Any other ways of specifying the trajectory provided at S10 may however be contemplated.

The method then comprises a specific processing for each dexel D of the modeled volume. First the method computes at S20, with respect to each mesh M, the extremity points of all polylines (noted L1, L2, L3 in the following) that form a so-called "(h,t) diagram" of the simulation. By definition, the polylines describe (h,t) positions, in other words 2D positions with an abscissa corresponding to a height on the dexel (e.g. using the above-mentioned definition of height, e.g. based on any—e.g. arbitrary—origin/reference and/or on any—e.g. arbitrary—scale) and an ordinate corresponding to a time. Any height scale and/or time scale may be implemented, as long as the scale is consistent (e.g. the same) for a given dexel throughout the method. For an easier implementation, the same scales may be implemented for all dexels. Regarding the height scale, in case of a tridexel structure, such as for example the one of FIGS. 10-12, the origin for each direction may be defined on a same plane—for all dexels supported by a line having the same direction—orthogonal to said lines. It is to be noted that all these data are not necessarily computed at S20, which only requires to have comparable (h,t) positions (which may be represented as mere integer and/or real number couples (i.e. ordered pair) of values, without any further information (apart from the cutting/clashing attribute information). Thus, the (h,t) diagram, described in more details later, and even the polylines, have to be understood as a mathematical object to which the data processed by the method are associated (in specific, the data computed at S20 comprise the extremity points of all polylines of the diagram).

Now, the polylines describe/represent, by definition, a time t of intersection between the line of the respective dexel D and the respective mesh (a polyline being thus associated to a respective mesh of the set of meshes, being noted that one mesh may be associated to several respective polylines depending on the complexity of the trajectory, and the complexity of the mesh as well, being noted that if a mesh defines a convex volume, it may engender a single polyline—e.g. on a translation trajectory—whereas if the mesh does not define a convex volume it may engender as many polylines as its visible part has connected parts for the same trajectory) as a function of a height h of intersection, according to the trajectory of the cutting tool (being noted that, as mentioned above, any timing/speed may be retained for the trajectory, for example a constant time so have to obtain polylines each consisting of connected perfect segments, the main properties of the (h,t) diagram detailed later applying to more general cases as well anyway). Indeed, each mesh is virtually moved according to the trajectory and thereby virtually encounters/intersects the line of each dexel (being noted that a non-intersection—for example, the mesh never encounters a given line—may be mathematically—and thus in the implementation—seen as a void-intersection associated to a void/null polyline, without loss of generality). The method virtually tracks the height of such encountering relative to time for all meshes. The method then virtually contemplates the time of encountering relative to the height (inversion of the tracked data). But the method eventually computes at S20 only extremity points of said polylines.

Thanks to S20 and considering all polyline extremity points (for all meshes), and thanks to the specific nature of the (h,t) diagram, the method may then simply test at S30 (still for each dexel) if there is a collision or not, and it may further provide the depth of collision (dexel line, and boundary heights of collision on the dexel line) should it be the case. The testing S30 includes in specific determining if, for a value of height that corresponds to a position that belongs to the lower envelope of the set of all polylines of all meshes, the polyline to which the position belongs being associated to a non-cutting part, the value of height belongs to a segment of the dexel (i.e. the value of height is also included in a material interval stored in the dexel). It is noted that here again, the lower envelope of the set of all polylines of all meshes (defined as the minimum-time positions—in other words the (h,t) couples—of the polylines relative to height, in the classical lower envelope definition when regarding the polylines in the (h,t) diagram, with respect to the specific orientation of the (h,t) diagram, in other words with respect to time, yet in other words with respect to the projection on the h-axis) is only a mathematical object virtually contemplated, the testing needing not such object to be computed in effect. It is noted that the lower envelope in a 2D diagram of polylines is also a 2D object defines as the part of the polylines that can be seen by observer sitting at (0, −∞) and looking upward. Note that the polyline in the (h,t) plane given by the intersection between the swept mesh and the dexel is the graph of a piecewise linear function. Thus the computation of the lower envelope with respect to time-value is nothing more than the application of the classical definition. Indeed, it is only tested if a point on a segment/interval of the dexel (thus corresponding to workpiece material, as opposed to non-segment positions of the dexel which corresponds to air/void) is encountered first (chronologically) by a cutting mesh or a clashing mesh. This may be done easily with the mathematical shortcut provided above (thanks to the properties of the (h,t) diagram explained later), once all extremity points of all polylines are gathered and associated to the "cutting" or "clashing" label/attribute, based on the type of mesh their polyline corresponds to. In a way, this amounts to projecting the lower envelope of the polylines on the dexel and determine, for each position of each segment of the dexel, if a clashing labeled position has been the first to be projected (in which case there is collision, since in the contrary case—i.e. a cutting labeled position has been first projected or no polyline position at all has been projected—there is no collision, either because there is an encountering with a cutting part and thus removal of the material, or no encountering at all).

Obviously, once the test S30 is performed, e.g. notably if the conclusion of the test is that there is no collision, the method may comprise updating the set of dexels by removing segments or parts thereof, according to the positions—i.e. height—of intersections (e.g. and time thereof) with cutting parts of the cutting tools. Such data may actually be part of the data determined at S20 and/or S30.

Thus, the method allows a fast detection of collisions, and it can even provide collision depths accurately (amplitude and location of collisions), which can be performed via massive parallelization over the dexels. It is noted that tackling the problem of an exact solution (which provides a robust and comprehensive collision detection) has not been performed in the prior art (although machining simulation has been researched for many years already), probably because it was considered that obtaining a full-time description of the machining was too complex (from a computation point of view). In essence, continuous problems are naturally avoided, because of the unlimited complexity that their computer-implemented solution may theoretically present. However, the method reaches the exact solution by discretizing the problem (basing the test S30 upon extremity points computed at S20, and thus a discretized set of inputs). The discretization is however not performed on time (as in time-series prior art methods), but on the dexels, which leads to a more realistic solution. This is does by exploiting specific properties of the underlying diagram supporting said extremity points. This is detailed later. Moreover, this representation is more suitable for massively parallel computation, allowing good performance even with fine workpiece discretization.

In examples, the method makes use of the trajectory provided at S10 to compute (within S20) swept volumes (e.g. by sweeping the triangulated boundary of a solid) and/or swept surfaces. A typical reference is: *Swept Volumes*, M. Petemell, H. Pottmann, T. Steiner, H. Zhao, Computer-Aided Design & Applications, Vol. 2, No. 5, 2005, pp 599-608. This notion is detailed hereunder.

Given $M \subset \mathbb{R}^3$ a subset of the three dimensional space and given a point $P \in \mathbb{R}^3$, notation M+P is the translation of set M at P. Precisely, $M+P=\{x+P, x \in M\}$.

Given a mesh M and given $P_{start} \in \mathbb{R}^3$, $P_{end} \in \mathbb{R}^3$ respectively the starting and ending points of an elementary trajectory, the sweep S(M) of mesh M along the elementary trajectory is defined by:

$$S(M) = \bigcup_{t \in [0,1]} M + (tP_{end} + (1-t)P_{start})$$

Figure 13:
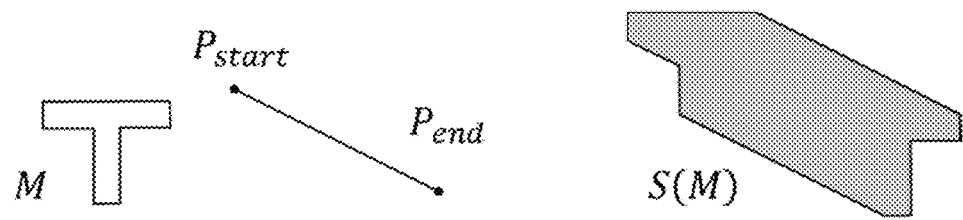

The sweep is the union of all translations of M along the line segment $[P_{start}, P_{end}]$. In previous formula, parameter $t \in [0,1]$ plays the role of time. At t=0, mesh M is translated at position $P_{start}$, which is written $M+P_{start}$. At t=1, mesh M is translated at position $P_{end}$, which is written $M+P_{end}$. This is shown on FIG. 13 (in 2D for clarity).

Figure 14:
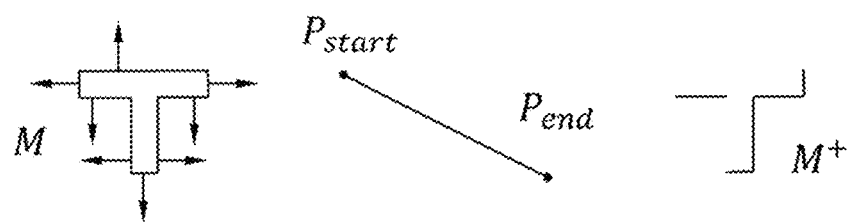
Figure 15:
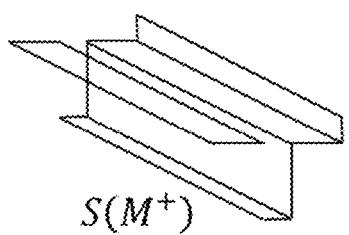
Figure 16:
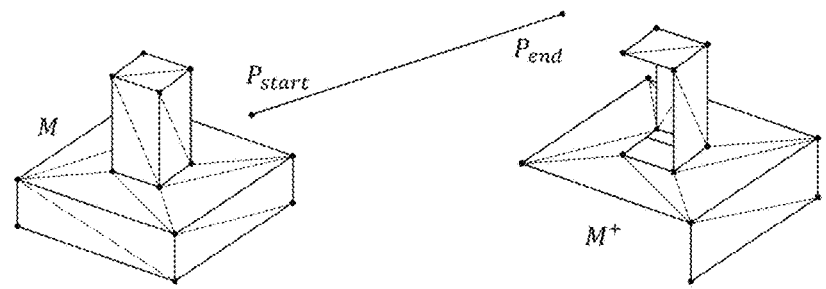
Figure 17:
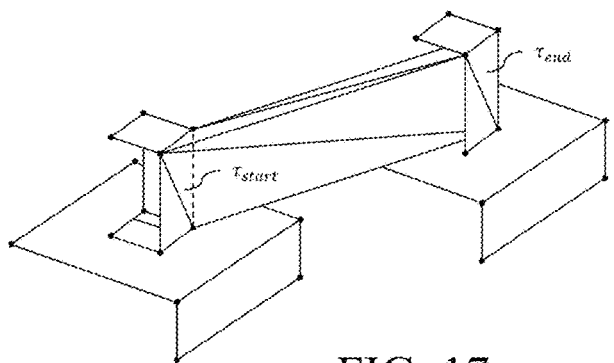

For computational purpose and for robustness purpose (notably to contemplate exploitable polylines, as opposed to cycle polylines), only the visible part of M may be used by the method (more details being provided later). The visible part of M, noted $M^+$ is the set of points $P \in M$ such that the scalar product of $P_{end} - P_{start}$ and outer normal of M at P, noted $N_P$, is positive, that is $\langle P_{end} - P_{start}, N_P \rangle > 0$. FIG. 14 illustrates a 2D example of visible M. Since $M^+$ is made of line segments, the swept area $S(M^+)$ is made of adjacent parallelograms, as illustrated in FIG. 15. The 3D version of a triangulated M is illustrated in FIG. 16. Left drawing is M, right drawing is $M^+$ according to $P_{start}$ and $P_{end}$. FIG. 17 illustrates the sweeping of one triangle of $M^+$. It results in an elementary swept volume, which is a prism including the following boundary faces (i.e. outer faces of the volume defined by the integral—the sweep—of the triangle mesh face over the trajectory, such boundary faces being possibly defined in any way as long as they form a partition of the whole outer surface of the swept volume, for example as all largest planes of said outer surface, or largest triangulation thereof): a starting triangle $\tau_{start}$, an ending triangle $\tau_{end}$ and six side triangles. (It is noted that the prism is also the Cartesian product of the triangle with the 1D segment defining time along the trajectory, as explained in *Mathematical Analysis and Numerical Methods for Science and Technology* p 229.) These six side triangles turn out to be three parallelograms when dealing with a three axis machining trajectory. The resulting swept volume $S(M^+)$ is made of adjacent such prisms: one prism for each triangle of $M^+$. Notice that, for clarity, not all triangles are illustrated.

Figure 18:
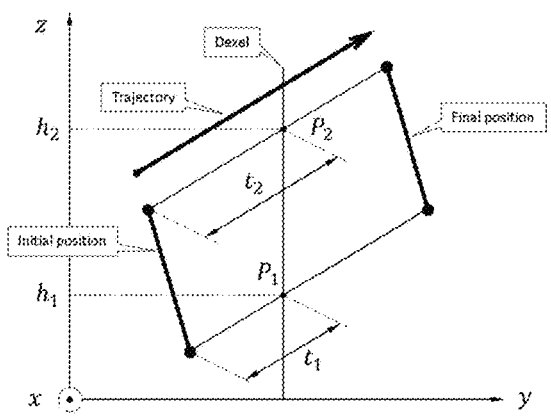

The method contemplates smartly the so-called (h,t) diagram. FIG. 18 illustrates a line segment M (bold line) in the yz space that is swept (with constant speed) from an initial to a final position according to a trajectory (bold arrow). The swept area S(M) of M is a parallelogram.

The (h,t) diagram associated with the dexel (vertical line) is now detailed. The first step to draw a (h,t) diagram, which actually does not necessarily need to be performed by the method, as explained above) is to compute the intersection points between the dexel line and the boundary of the swept area S(M), which yields points $P_1$ and $P_2$. From these intersection points, height $h_1$ and $h_2$ are there respective abscissae on the dexel line. Then, thanks to a (e.g. constant) speed motion hypothesis, times $t_1$ and $t_2$ are computed accordingly, as illustrated in FIG. 18. The mathematics of the computation are detailed later.

Figure 19:
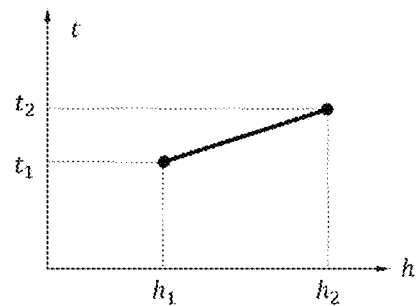

Now, the (h,t) diagram associated with the dexel is sketched. It is a 2-dimensional diagram (even for a 3-dimensional workpiece and tool). Height values $h_1$ and $h_2$ are reported on the horizontal h axis and time values $t_1$ and $t_2$ are reported on the vertical t axis. This defines a line segment joining points $(h_1, t_1)$ and $(h_2, t_2)$, as illustrated in FIG. 19.

The physical interpretation is as follows. When time $t<t_1$, the dexel line does not see the moving line segment M. At time $t=t_1$, the lower vertex of line segment meets the dexel line at height $h_1$. From time $t=t_1$ to time $t=t_2$ the intersection point between the line dexel and the moving line segment M is a point moving from $P_1$ to $P_2$ along the said line dexel. The dependency between t and h is linear. When $t>t_2$ the dexel does not see the moving line segment M anymore.

Figure 20:
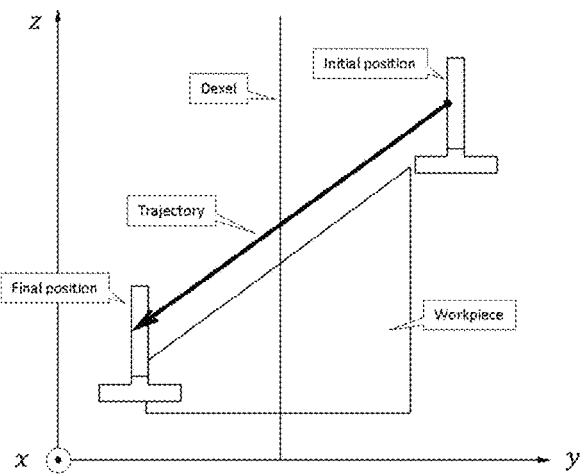

For clarity, the following discussion is fully illustrated with a 2-dimensional workpiece and tool. Consider now the 2D workpiece, tool, trajectory and dexel shown on FIG. 20.

Figure 21:
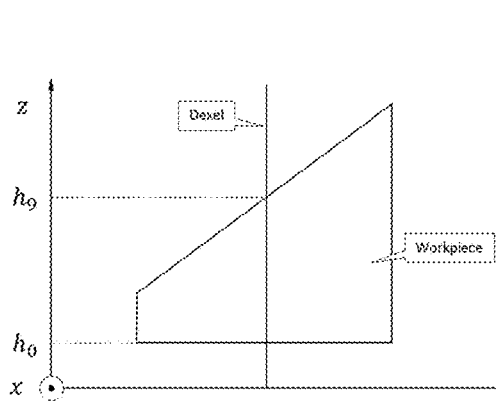
Figure 22:
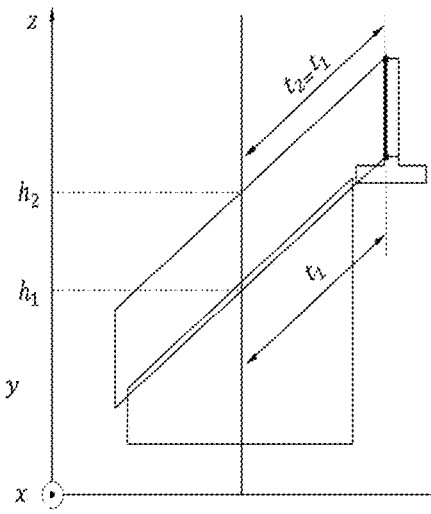
Figure 23:
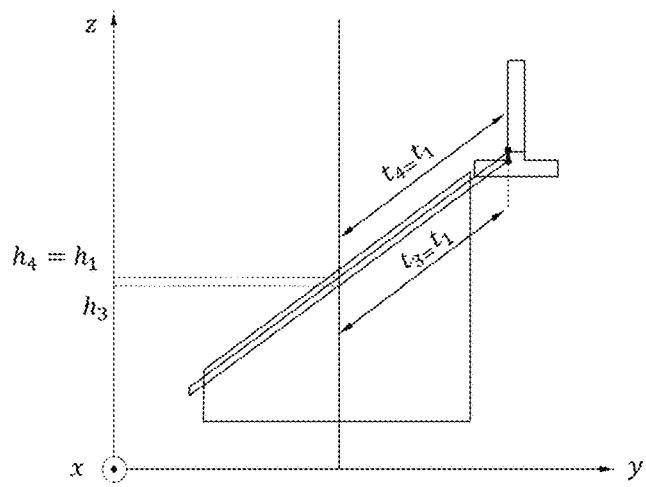
Figure 24:
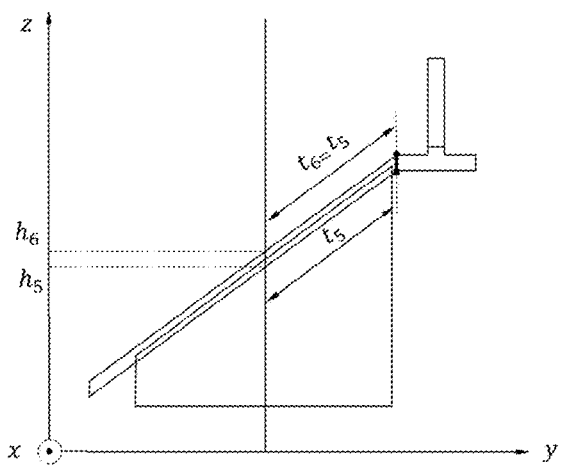
Figure 25:
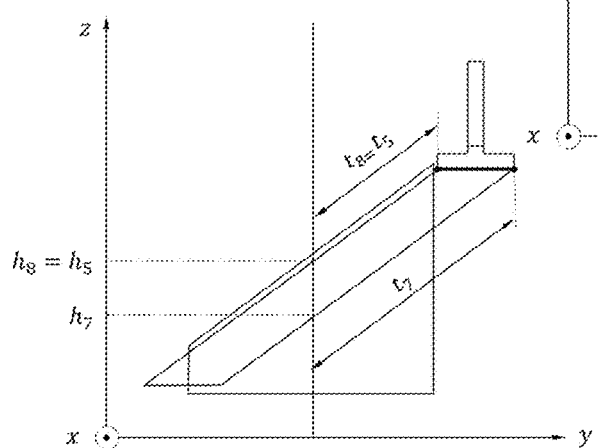

The very first step is to compute the initial workpiece interval, which is the intersection between the dexel line and the workpiece. This yields values $h_0$ and $h_9$ as illustrated in FIG. 21. Depending on the shape of the workpiece, its intersection with the dexel may include several intervals. Then, the swept volume of the non-cutting part of the tool is computed and its intersection with the dexel line yields $t_1$, $t_2$, $h_1$, $h_2$ as illustrated in FIG. 22. Then, the swept volume of the first cutting part of the tool is computed and its intersection with the dexel line yields $t_3$, $t_4$, $h_3$, $h_4$ as illustrated in FIG. 23. Then, the swept volume of the second cutting part of the tool is computed and its intersection with the dexel line yields $t_5$, $t_6$, $h_5$, $h_6$ as illustrated in FIG. 24. Then, the swept volume of the third cutting part of the tool is computed and its intersection with the dexel line yields $t_7$, $t_8$, $h_7$, $h_8$ as illustrated in FIG. 25.

Figure 26:
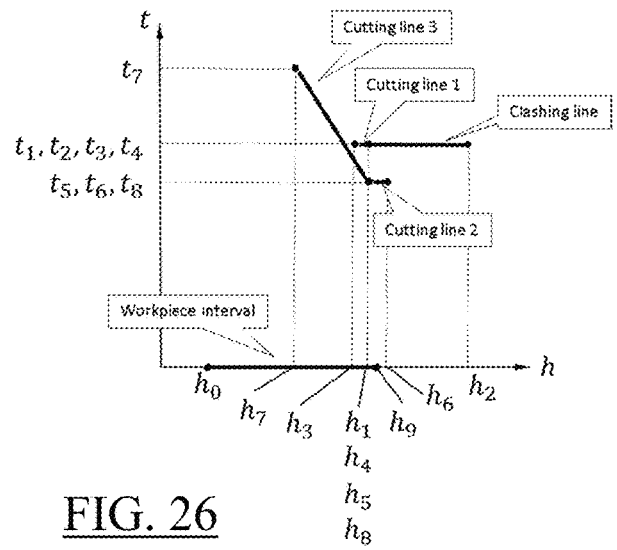

All previous height and time computations are now gathered in the (h,t) diagram of dexel D, as illustrated in FIG. 26. The $[h_0, h_9]$ segment is the so called workpiece interval, which is the intersection between the dexel line and the workpiece. It is represented on the h axis. The (h,t) diagram captures temporal and spatial information so that an accurate collision diagnosis can be performed.

The (h,t) diagram includes a set of non-vertical line segments labeled "cutting" or clashing". The collision diagnosis (S30) may be implemented as follows. From all points of the workpiece interval, draw a vertical line in the t direction. If each such line meets a cutting line before a clashing line, there is no collision. Otherwise, there is a collision. In the example, there is no collision, as expected, because cutting lines 2 and 3 are located underneath the clashing line according to the t direction.

The earlier-mentioned properties of the (h,t) diagram, which lead to the simplicity and robustness of the collision diagnosis of the method are now discussed.

Figure 27:
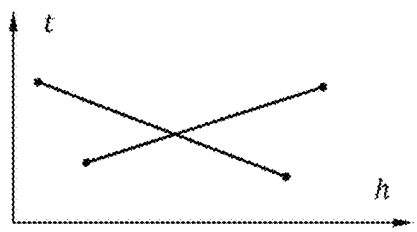
Figure 28:
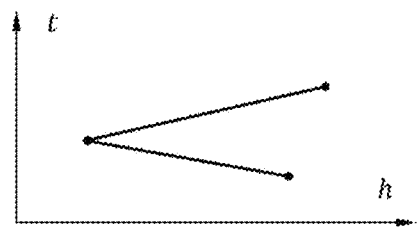

By construction, the (h,t) diagram includes a set of non-vertical line segments (which is ensured by the fact that the trajectory may be rigid motion with the exclusion of punctual trajectory—i.e. PStart≠PEnd) labeled "cutting" or clashing". These line segments feature useful properties for accelerating computations. Firstly, two line segments cannot cross at an internal point, unlike what is illustrated in FIG. 27. Secondly, two line segments cannot share an end point and overlap, unlike what is illustrated in FIG. 28. This is because the interior of the cutting part and the interior of the non-cutting part cannot be located at the same place at the same time.

Consequently, line segments of the (h,t) diagram can be arranged as a set of cutting polylines and clashing polylines, each one being defined by a mathematical mapping $L_i:[h_i^0, h_i^1] \to \mathbb{R}^+$ (more precisely as the graph of such piecewise linear mapping). Furthermore, any two polylines cannot cross at an internal point. The convention $L_i(h)=+\infty$ if $h \notin [h_i^0, h_i^1]$ facilitates the minimum value computation in the following.

The 2D example features a cutting polyline $L_1:[h_7, h_6] \to \mathbb{R}^+$, a cutting polyline $L_2:[h_3, h_4] \to \mathbb{R}^+$ and a clashing polyline $L_3:[h_1, h_2] \to \mathbb{R}^+$.

An example of S30 (Computing the collision diagnosis) is now discussed. This example is merely one possible implementation, and the general ideas of the example may be implemented in other ways.

From the computational point of view, the collision diagnosis of a given dexel D is performed as follows in the example. Given polylines $L_i:[h_i^0, h_i^1] \to \mathbb{R}^+$, $i=1, \ldots, n$ and given B the union of all workpiece intervals of dexel D, the first step is to sort the set of numbers $h_i^0, h_i^1, i=1, \ldots, n$ into a list $h_1 \le h_2 \le \ldots \le h_{2n}$. It must be understood that this ordered list of mixes $h_j$ abscissas of clashing polylines and $h_j$ abscissas of cutting polylines. The second step is to identify all clashing intervals $[h_j, h_{j+1}]$, depending on the type of the lower polyline defined above it. Next algorithm computes the said clashing set C as the union of all clashing intervals $[h_j, h_{j+1}]$.

---
$C := \emptyset$
For j := 1 to 2n − 1 do begin
    m := ½($h_j$ + $h_{j+1}$)
    Find k ∈ {1, ... , n} such that $L_k$(m) = min{$L_i$(m), i = 1, ... , n}
    If the type of polyline $L_k$ is "clashing" then
        C := C ∪ [$h_j$, $h_{j+1}$]
    End if
End for

---

Collision occurs if and only if the workpiece set B meets the clashing set C, that is $C \cap B \ne \emptyset$. This means that material of the workpiece meets a non-cutting part of the tool before a cutting part of the tool along the dexel.

Figure 29:
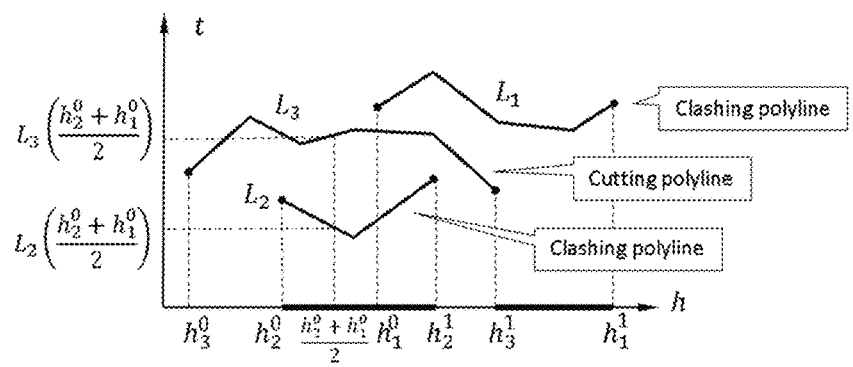
Figure 30:
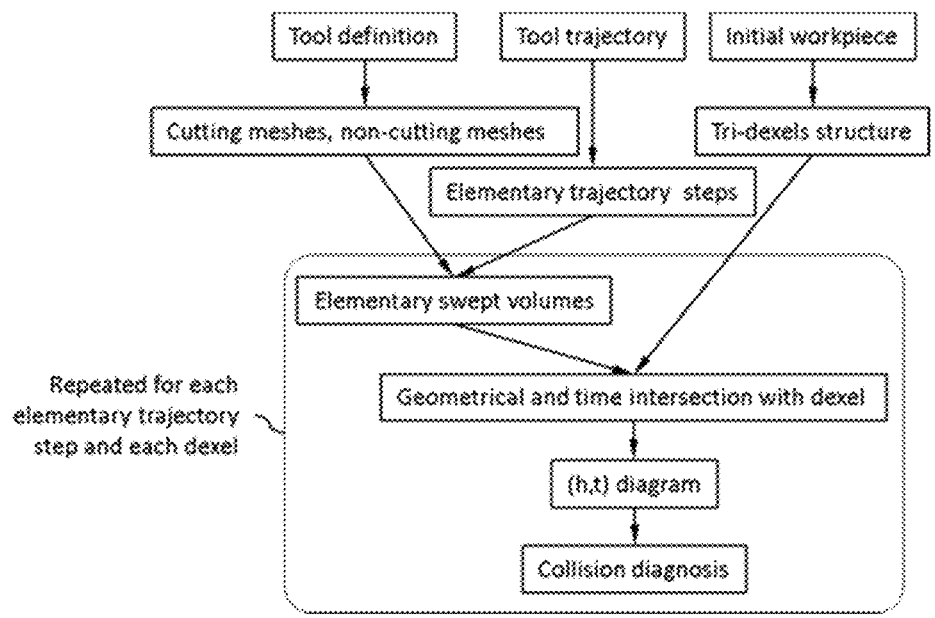

FIG. 29 illustrates the algorithm with three polylines $L_i:[h_i^0, h_i^1] \to \mathbb{R}^+$, i=1, 2, 3. The sorted list of $h_j$, i=1, ..., 6 abscissas is $h_3^0 < h_2^0 < h_1^0 < h_2^1 < h_3^1 < h_1^1$. The resulting clashing set is $C=[h_2^0, h_2^1] \cup [h_3^0, h_1^1]$. For example, interval $[h_2^0, h_1^0]$ is a clashing interval because $$L_2\left(\frac{h_2^0 + h_1^0}{2}\right) < L_3\left(\frac{h_2^0 + h_1^0}{2}\right)$$

and because $L_2$ is a clashing polyline. The workpiece set is not illustrated.

Back to the 2D example, the clashing set is $C=[h_6, h_2]$ which does not meet the workpiece interval $B=[h_0, h_9]$, so there is no collision along the dexel.

A summary of the (at least conceptual) scheme followed by the method is discussed hereunder (being once again noted that the method may only rather compute polyline extremity points only).

The tool includes adjacent cutting parts and non-cutting parts. Each part is modeled by its triangularized closed boundary, called a "mesh". The workpiece is modeled by a tri-dexels structure. The sweep of an object is the union of translated copies of the object along the trajectory. An elementary step of the tool trajectory is the motion of the tool between two consecutive positions. Without any loss of generality, the method may consider that time varies linearly between two consecutive tool positions: at start, time equals 0 and at end, time equals 1. While computing the intersection between a dexel and the tool sweep, the method may also computes the time at which each tool mesh intersects the dexel. By sorting the resulting set of times, the method is able to determine everywhere which tool part firstly encounters the matter intervals stored on the dexel (remember that matter intervals represent the workpiece matter). If a non-cutting part first meets the matter, a collision is reported.

The key feature of the method in an example is to compute the time of intersection with a dexel only by using the geometry of the swept volume. This information is gathered in the so called (h,t) diagram. This results in a gain of speed, a gain of reliability and a gain of generality. Refining each elementary trajectory step is not needed, thus allowing good speed performance. Reliability does not depend on any numerical precision value. Performance and reliability does not depend on the direction of displacement vector. Generality: the only assumptions made on input meshes are verified in most cases as these meshes are supposed to approach the boundary of real 3D solids. If needed, many existing algorithms can be used as preprocessor for repairing these meshes.

More specifically, in an example the computing S20 of the extremity points of all polylines (for example above-noted L1, L2, L3) comprises, for each mesh M, and for each extremity point of a respective polyline, a sub-step (noted S282) of determining, based on all faces of the mesh associated to the respective polyline, the boundary face of a volume S(τ) swept by a face of the mesh, according to the trajectory of the cutting tool, with which intersection of the line of the dexel corresponds to the extremity point. Thanks to the definition of the (h,t) diagram and of the polylines forming it, and thanks to 3D geometry theory, the extremity point of a polyline corresponds to the intersection of the supporting line (of the respective dexel) and the outer boundary of the volume swept by one of the faces of a respective mesh. One may speak of a "boundary face" of the volume S(τ) swept by said face of the mesh, with reference to the discussion relative to FIG. 17. The method determines such boundary face among all potential boundary faces (being noted that all such boundary faces need not necessarily be computed). The computing S20 of the example then comprises a sub-step (noted S284) of computing the time and the height that define the respective extremity point (relative to the scales retained) based on such (geometrical) intersection between the line of the dexel and the determined boundary face. This allows a simple computing S20. Indeed, the computation of this time may come directly from geometric considerations, as time and height vary linearly as long as the 3D intersection point remains in the same prism.

This way of computing the "h" parameter through 3D line/triangle intersection is now further detailed in an example.

Consider a triangle $\Delta \subset \mathbb{R}^3$ and a line $D \subset \mathbb{R}^3$. The goal is to test whether the line intersects the triangle, and to compute the coordinates of the intersection point in the dexel frame, if any. In particular, these coordinates may include (or at least lead to) the height on D.

Let Q a plane perpendicular to D, and d the intersection point of D and Q. Noting xyz the reference axis system, if D is parallel to z axis (which may represent the height), then Q is the xy plane and D is defined by two coordinates ($x_D$, $y_D$) in plane xy (which may represent the supporting plane of the dexel grid). If D is parallel to y axis, then Q is the zx plane and D is defined by two coordinates $(z_D, x_D)$ in plane zx. If D is parallel to x axis, then Q is the yz plane and D is defined by two coordinates $(y_D, z_D)$ in plane yz.

Figure 31:
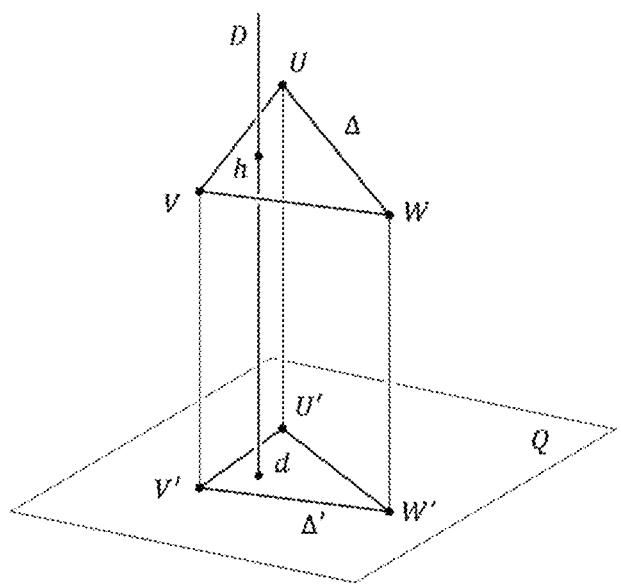

Let U, V, W be the vertices of triangle $\Delta$ and U', V', W' their respective projections on plane Q defining the 2D triangle $\Delta'$. FIG. 31 illustrates the geometry when D is parallel to z axis.

It is well known from state of the art that line D meets triangle $\Delta$ if and only if point d is inside triangle $\Delta'$. Point d is inside triangle $\Delta'$ if and only if all three algebraic areas Area(d, V', W'), Area(U', d, W') and Area(U', V', d) have the same sign. Furthermore, the height h of the intersection point $D \cap \Delta$ is:

$$h = \frac{h_U \text{Area}(d, V', W') + h_V \text{Area}(U', d, W') + h_W \text{Area}(U', V', d)}{\text{Area}(A', B', C')} \quad (1)$$

where $h_U$, $h_V$ and $h_W$ are respectively the height of points U, V, W along line D.

Finally, 3D coordinates of point $D \cap \Delta$ are known by joining the 2D coordinates of D in plane Q together with h. If D is parallel to z axis, then $D \cap \Delta = (x_D, y_D, h)$. If D is parallel to y axis, then $D \cap \Delta = (x_D, h, z_D)$. If D is parallel to x axis, then $D \cap \Delta = (h, y_D, z_D)$.

This way of computing the "t" parameter is now discussed in an example.

Consider the situation of a triangle $\tau \subset \mathbb{R}^3$ translated from $P_{start} \in \mathbb{R}^3$ to $P_{end} \in \mathbb{R}^3$. Let T be the corresponding swept volume (which is a non-degenerated prism):

$$T = S(\tau) = \bigcup_{t \in [0,1]} \tau + (tP_{end} + (1-t)P_{start})$$

Figure 32:
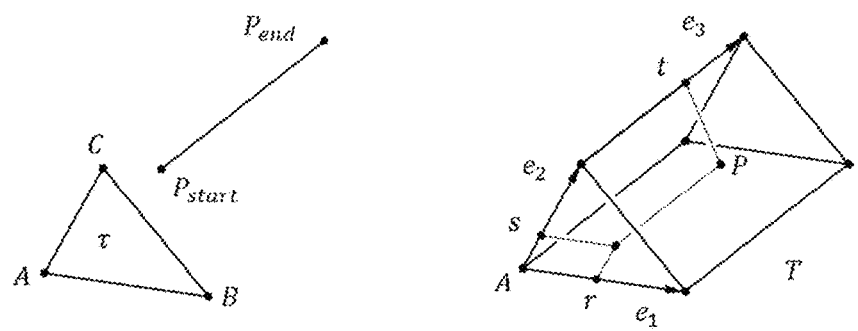

Let A, B, C be the vertices of triangle $\tau$, $e_1 = B-A$, $e_2 = C-A$ and $e_3 = P_{end} - P_{start}$. This is illustrated on FIG. 32. Let $\tau_{start} = \tau + P_{start}$ be the initial copy of triangle $\tau$ and $\tau_{end} = \tau + P_{end}$ be the final copy of triangle $\tau$. Since triangle $\tau$ is not degenerated, vectors $e_1$ and $e_2$ are not collinear. Since triangle $\tau$ is not translated along its supporting plane, vector $e_3$ does not belong to the plane spanned by $e_1$ and $e_2$. This makes the matrix $[e_1 \ e_2 \ e_3]$ invertible. Consequently, any point $P \in T$ is uniquely represented by three numbers r, s and t such that:

$$P = A + re_1 + se_2 + te_3$$

Notice that vectors $e_1$, $e_2$, $e_3$ are not normalized and that they are not mutually perpendicular.

Given the coordinates of point P, the numbers r, s and t can be computed by solving the linear system:

$$\begin{pmatrix} r \\ s \\ t \end{pmatrix} = [e_1 \ e_2 \ e_3]^{-1}(P-A) \quad (2)$$

Number t plays the role of time when the triangle $\tau$ moves from $P_{start}$ to $P_{end}$. When t=0, point P belongs to $\tau_{start}$, when t=1, point P belongs to $\tau_{end}$, and when 0<t<1, point P belong to the intermediate triangle $\tau + (tP_{end} + (1-t)P_{start})$.

Generalization to (h,t) diagram from 3-dimensional geometry is now discussed.

Prism T includes two triangles ($\tau_{start}$ and $\tau_{end}$) and three planar parallelograms. Parallelograms are triangulated so that prism T includes six side triangles in addition to $\tau_{start}$ and $\tau_{end}$. Given such a triangulated prism and a dexel line D, computing $D \cap T$ is a matter of line/triangle intersection, as explained in previous paragraphs. Let $P \in D \cap T$. Its h parameter is computed by using formula (1) and its t parameter is computed by using formula (2). If P belongs to $\tau_{start}$, its t parameter is t=0. If P belongs to $\tau_{end}$, its t parameter is t=1.

A data structure may associate in an example as many (h,t) parameters with dexel D as there are points in $D \cap T$ and as many as there are prisms T featuring a non-empty intersection with D. In an example, only extremity points of polylines are retained or even computed in the first place.

Figures 33, 34:
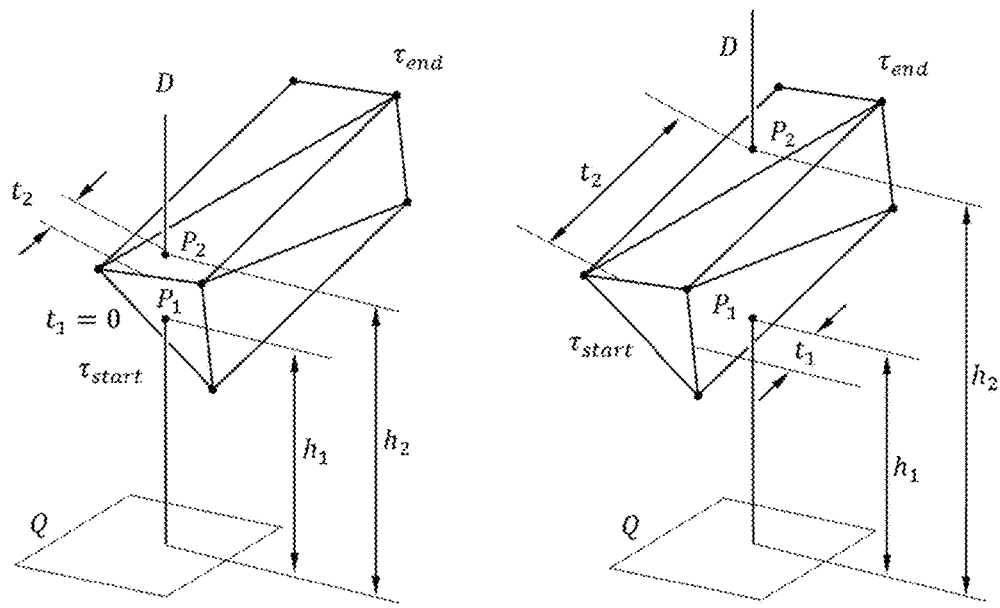

FIG. 33 illustrates $D \cap T = \{P_1, P_2\}$ where $P_1 \in \tau_{start}$, meaning that $t_1 = 0$, and $P_2$ belongs to a side triangle, meaning that $0 < t_2 < 1$. The data structure associates $(h_1, t_1)$ and $(h_2, t_2)$ with dexel D. FIG. 34 illustrates $D \cap T = \{P_1, P_2\}$ where $P_1$ and $P_2$ belong to side triangles, meaning that $0 < t_1 < 1$ and $0 < t_2 < 1$. The data structure associates $(h_1, t_1)$ and $(h_2, t_2)$ with dexel D.

Generalization of the example computations discussed with reference to FIGS. 31-34 to 5-axis trajectory is now discussed.

Methods for an elementary trajectory defined by a translation can be generalized to an elementary trajectory defined by a rigid motion including a rotation. This is all the more precise provided the angle value of the rotation is small enough. The following explains how to compute (h,t) parameters in this situation.

Figure 35:
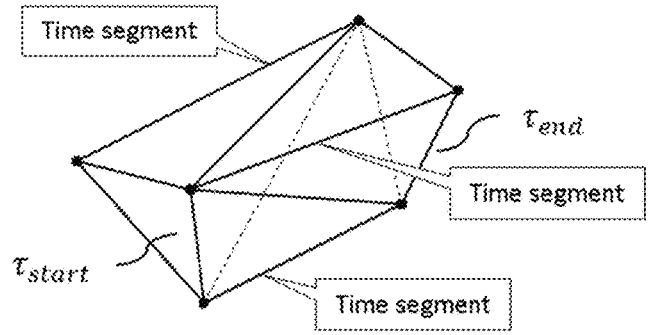
Figure 36:
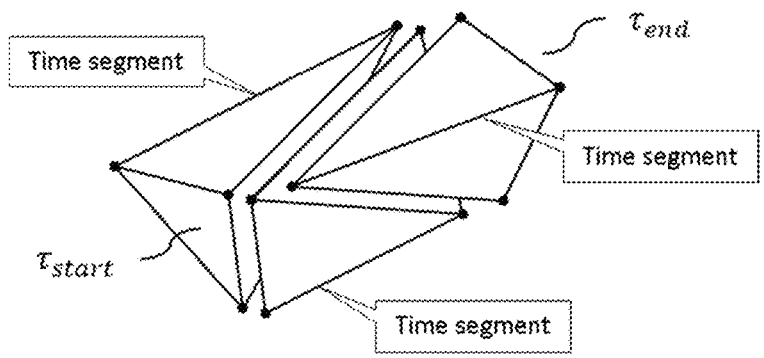
Figure 37:
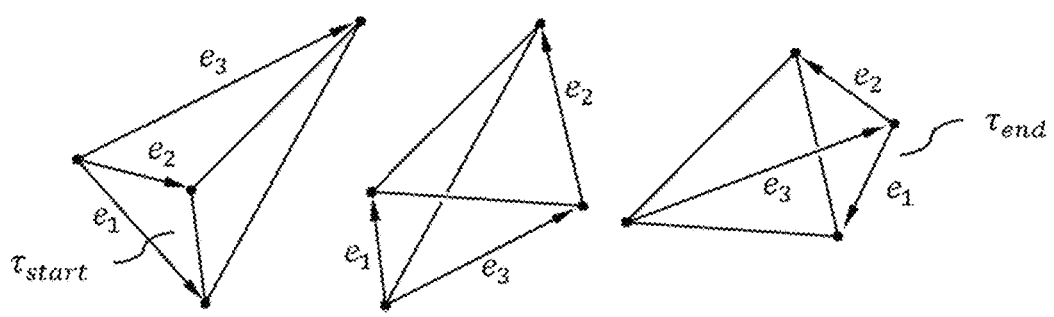

Let $\tau_{start}$ and $\tau_{end}$ be the initial and final triangles of the elementary trajectory. The boundary of the swept volume is approximated by six side triangles together with triangles $\tau_{start}$ and $\tau_{end}$. The three line segments joining vertices of $\tau_{start}$ to their respective copies in $\tau_{end}$ are named "time segments", as illustrated in FIG. 35. Then, the approximate swept volume is split into three tetrahedrons. One of them includes $\tau_{start}$ and another one includes $\tau_{end}$. Each tetrahedron includes only one time segment, as illustrated in FIG. 36. Vectors $e_1$, $e_2$, $e_3$ are associated to each tetrahedron according to the following strategy. Vector $e_3$ is the time segment, vectors $e_1$, $e_2$ are edges of $\tau_{start}$ and/or $\tau_{end}$ incident to $e_3$. FIG. 37 illustrates $e_1$, $e_2$, $e_3$ vectors for each tetrahedron.

Computation of (h,t) parameters is performed by intersecting the line dexel with each boundary face of each tetrahedron and by using formulas (1) and (2). Polylines of (h,t) diagrams are generated accordingly.

The above discussion provides general details on the aspects of the method, details on the general intuition behind the method (i.e. the (h,t) diagram), and examples of some computations performed by the method to retrieve polyline extremity points via geometrical intersections (e.g. describing in details the interaction between one dexel and the triangles of one prism notably). However, real-life machining simulation involves a huge number of dexels and triangles, making the computing time a critical issue. The following describes an example of the method on how dexels are arranged and how the topological adjacency of prism (induced by sweeping adjacent triangles) is used to accelerate the computations.

In this example, the computing S20 of the extremity points of all polylines (such as L1, L2, L3) further comprises, for each mesh M, first a sub-step of determining (noted S22) the visible part (M+) of the mesh (M). The visible part is, as explained with reference to FIGS. 14-16, the portion (e.g. smallest subset of faces) of the mesh directed toward the trajectory of the cutting tool. It is noted that M+ may comprise several sub-meshes (that is, separated sub-meshes each consisting of connected faces). This may be performed in any way. The computing S20 then comprises a sub-step of computing (noted S24) the boundary (noted $\partial S(M^+)$) of a volume ($S(M^+)$) swept by the visible part, according to the trajectory of the cutting tool. This is performed as explained above, using prisms and/or tetrahedrons. And then, the computing S20 comprises an iteration sub-step (noted S28), which iterates, for each extremity point of a respective polyline (to be computed), the determining noted S282 mentioned above, and the computing noted S284 mentioned above. The determining S282 of the boundary face consists of identifying a respective boundary face of the computed boundary $\partial S(M^+)$ of the volume ($S(M^+)$) swept by the visible part. Indeed, by construction, an extremity point of a polyline in the (h,t) diagram corresponds to an intersection between a dexel line and a boundary face of a volume swept by a mesh face, and not any boundary face, but one that forms the boundary $\partial S(M^+)$. The method of the example thus makes smart use of the geometrical properties of the problem to increase efficiency.

The computing S20 of the example may further comprise, for each mesh M (obviously), determining S26 adjacency information relative to volumes swept by the faces of the visible part. This information may be any type of information indicating which volumes swept by faces (e.g. prisms and/or tetrahedrons) are adjacent. This is performed in a straightforward way based on the topology of the mesh, based on adjacency and/or connectivity information of the faces in the mesh. This topological information nevertheless allows great speed efficiency.

Indeed, for each respective polyline, the computing S20 may then include the determining S282 a "first" (or "entry") face of the computed boundary $\partial S(M^+)$ and a "second" (or "exit") face of the computed boundary $\partial S(M^+)$ in different ways. The extremities of a respective polyline correspond in general, by definition, to two 3D points (i.e. those at intersections between a same dexel line and two elements of the computed boundary $\partial S(M^+)$). Now, in the iterating S28 implemented in the example, the method contemplates such boundary faces by pairs (i.e. a "first face" where a dexel line e.g. enters and a "second face" where the dexel line e.g. exits the swept volume). The ordering ("first" and "second", "enters" and "exists") is purely arbitrary and depends on the implementation.

What matters is instead of brutally identifying all such faces, the method implements a so-called "topologically propagation" each time it has determined/found a first face, in order to find its associated face (i.e. the "second face"). Specifically, the determining S282 of the boundary face of the volume S(τ) associated to an extremity point of a polyline, consists of determining, by geometrical computation (thus regular 3D intersection and relatively heavy computation, such as the first computation step explained earlier with reference to FIGS. 31-37), a first face of the computed boundary $\partial S(M^+)$ intersected by the line of the dexel. But in an alternation during the iteration S28, the determining S282 of the boundary face of the volume S(τ) associated to the other extremity point of the same polyline, consists of determining, by topological propagation based on the adjacency information (and thus in a relatively very fast manner), the second face of the computed boundary $\partial S(M^+)$ intersected by the line of the dexel (in other words, the face associated to the first face in the pair, since the line of the dexel may intersect $\partial S(M^+)$ in more than one pair of points and thus possibly in more than one such pair or instance thereof).

This topological propagation feature is now further detailed.

Figure 38:
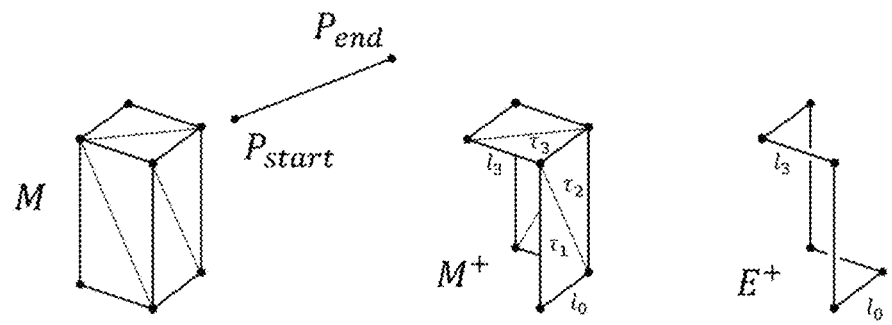

Computing dexel-triangles intersections is performed as follows in the example. Let M be the initial mesh, $P_{start}$ and $P_{end}$ be respectively the start and end points of the elementary trajectory. Let $M^+$ be the portion of M that is directed toward the elementary trajectory, and let $E^+$ be the boundary of $M^+$. Without loss of generality, assume that M+ is a connected set. By nature, $E^+$ is made of three-dimensional closed polylines. FIG. 38 exemplifies the situation.

Now, consider $S(M^+)$ the sweep volume of $M^+$ along direction $V=P_{end}-P_{start}$. The boundary of $S(M^+)$ is noted $\partial S(M^+)$. In fact, $S(M^+)$ is made of adjacent prisms and features the following properties:

Each prism $p_i$ is the extrusion of a triangle $\tau_i$ of $M^+$.
The boundary $\partial S(M^+)$ of $S(M^+)$ includes
 parallelograms extruded from edges of $E^+$
 triangles of $M^+$ at initial position $P_{start}$ and
 triangles of $M^+$ at final position $P_{end}$.
A parallelogram shared by two adjacent prisms $p_i$ and $p_j$ is the extrusion of an edge shared by triangles $\tau_i$ and $\tau_j$ of $M^+$.

Figure 39:
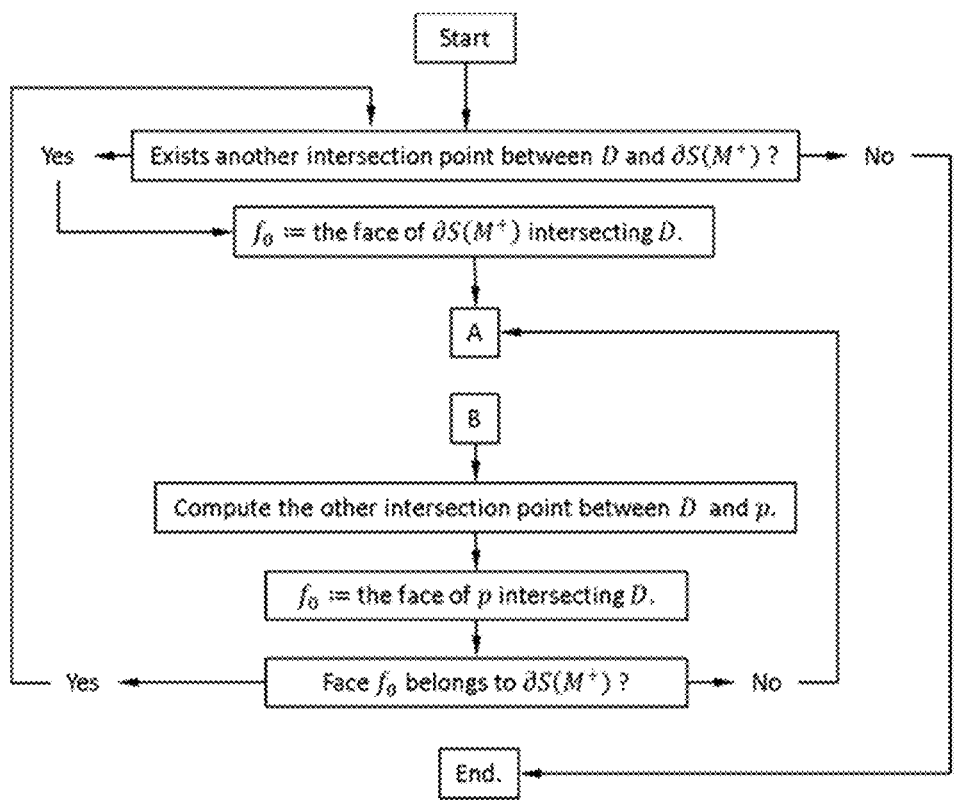

These adjacency properties are captured through an appropriate topological data structure. They are intensively used by the propagation algorithm. The first step is to compute an intersection point between D and $\partial S(M^+)$. The face $f_0 \in \partial S(M^+)$ where this intersection occurs initiates the topological propagation. Then, the next prism p of $S(M^+)$ to be intersected with D is found by visiting the neighborhood of $f_0$. This is performed between labels A and B of the diagram of FIG. 39.

The propagation ends when computing a point that is on the boundary of $S(M^+)$. The algorithm continues by searching another intersection point between D and a boundary face of $S(M^+)$ as in the general ease, $M^+$ may not be a connected set. It should be noticed that, according to this propagation method, h values computed from intersection points are naturally sorted altogether, which increases efficiency. This property is used to build (h,t) diagrams (i.e. without any sorting on h-values).

Figure 40:
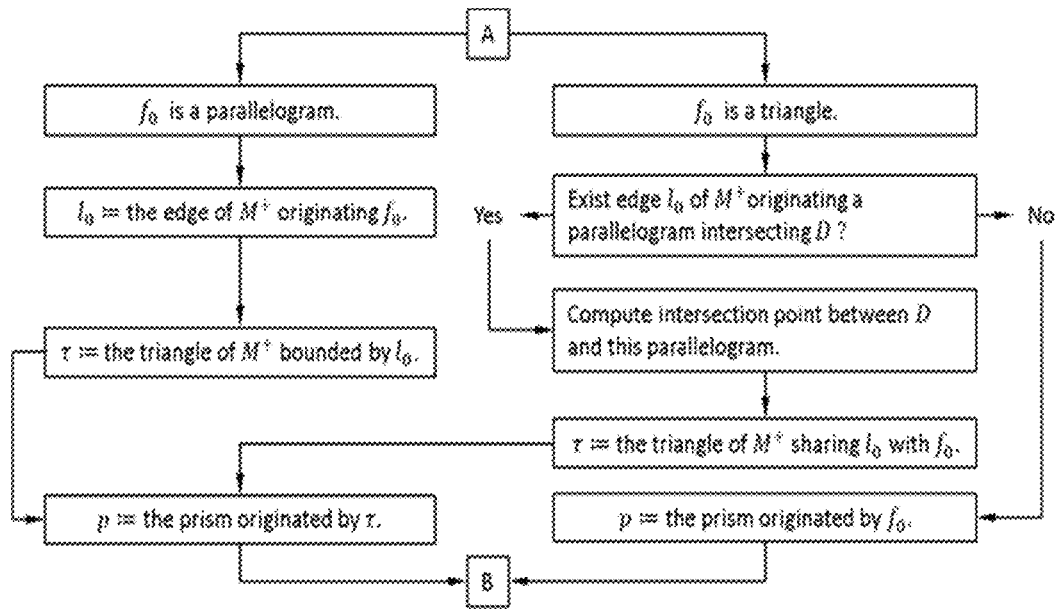

Now, the core of topological propagation is described. It takes place between labels A and B of the diagram of FIG. 40. Mainly, a bounding edge $l_0$ bounding or originating face $f_0$ is identified, as well as an appropriate triangle $\tau \in M^+$ related to $l_0$ or $f_0$. The next prism p is the one originated by triangle τ. The process depends on the nature parallelogram vs. triangle of face $f_0$, as described in the diagram of FIG. 40.

Figure 41:
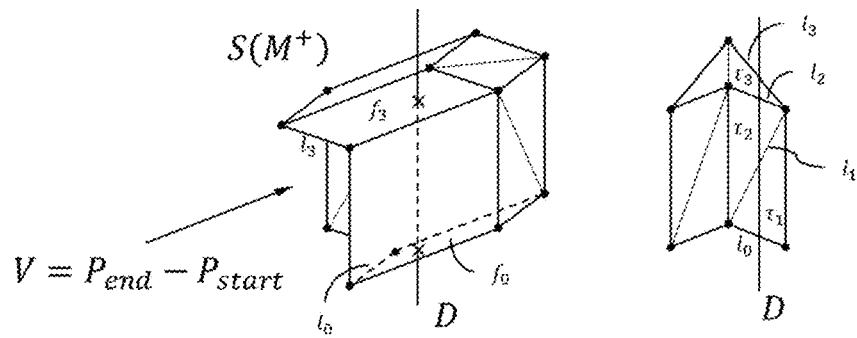

The algorithm is exemplified on the situation illustrated in FIG. 41.
 1. The intersection point between D and $\partial S(M^+)$ occurs in face $f_0$.
 2. Since face $f_0$ is a parallelogram, get the boundary edge $l_0 \in E^+$ that originated the boundary face $f_0$.
 3. Get the unique triangle $\tau_1$ bounded by $l_0$.
 4. Compute the other intersection point between D and faces of the extrusion $p_1$ of $\tau_1$.
 5. Get edge $l_1$ initiating the face $f_1$ of $p_1$ intersecting D.
 6. Get triangle $\tau_2$ sharing $l_1$ with $\tau_1$.
 7. Compute the other intersection point between D and faces of the extrusion $p_2$ of $\tau_2$.
 8. Get edge $l_2$ initiating the face $f_2$ of $p_2$ intersecting D.
 9. Get triangle $\tau_3$ sharing $l_2$ with $\tau_2$.
 10. Compute the other intersection point between D and faces of the extrusion $p_3$ of $\tau_3$.

11. Get edge $l_3$ initiating the face $f_3$ of $p_3$ intersecting D.
12. Edge $l_3$ is a boundary edge of $M^+$ so $f_3$ is a boundary face of $S(M^+)$ and the propagation ends because dexel D is locally out of $S(M^+)$.

Figure 42:
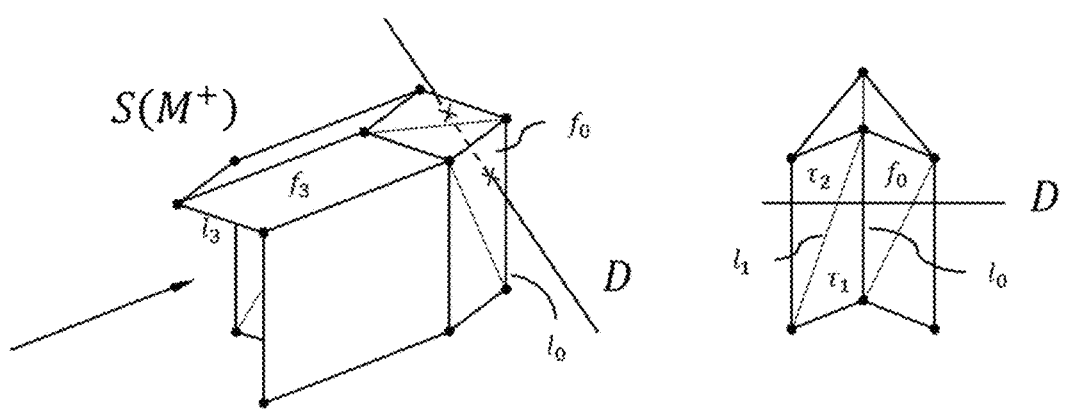

The algorithm is exemplified in another situation. Left drawing of FIG. 42 illustrates the situation where face $f_0$ intersecting dexel D is a triangle. Right drawing of FIG. 42 illustrates $S(M^+)$ seen from the viewpoint defined by $V=P_{end}-P_{start}$. In this right drawing, each triangle is the base of a prism that is perpendicular to the view plane.

1. The intersection point between D and $\partial S(M^+)$ occurs in face $f_0$.
2. Face $f_0$ is a triangle and edge $l_0$ is the one that generates a parallelogram intersecting D. Compute intersection point between D and this parallelogram.
3. Get the unique triangle $\tau_1$ sharing $l_0$ with $f_0$.
4. Compute the other intersection point between D and faces of the extrusion $p_1$ of $\tau_1$.
5. Get edge $l_1$ initiating the face $f_1$ of $p_1$ intersecting D.
6. Get triangle $\tau_2$ sharing $l_1$ with $\tau_1$.
7. Compute the other intersection point between D and faces of the extrusion $p_2$ of $\tau_2$.

The face $f_2$ of $p_2$ intersecting D is a boundary face of $S(M^+)$ so the propagation ends because dexel D is locally out of $S(M^+)$.

Now, as a further improvement, the determining S282 of first faces may implement rasterization over the set of dexels. In other words, the determining S282 of first faces is provided by a rasterization of all the elements of $\partial S(M^+)$ over the dexels seen as elements of 2D grid. The dexels may be considered as elements of a 2D grid (in the orthogonal plane to the grid, the dexels are 2D positions assimilated to pixels).

Dexels of each x, y and z direction are arranged into adjacent rectangular groups of nm dexels. Implementation shows n=m=8 gives good performance. Each dexels group is associated with its bounding box. Searching which dexel may intersect a given prism is filtered by first eliminating groups of dexels the bounding box of which do not meet the prism.

It is noted that the above examples do not limit the scope of the method, as obvious modifications are also contemplated. Notably, the above discussions always presented "clean" 3D intersections (between a dexel line and a boundary face, the intersection was always considered as a 3D position). It is however understood that obvious adaptations for extreme cases, including when a dexel line intersects a boundary face forming an intersection segment/line (rather than a point), where a dexel does not intersect one boundary face but several boundary faces at frontiers between them (lines between two faces, or even points, e.g. between more than two faces) are all contemplated by the method. The method may for example deal with these degenerate cases by relying on so-called exact predicates (see *Adaptive Precision Floating-Point Arithmetic and Fast Robust Predicates for Computational Geometry*), which ensure robustness and efficiency. All specific and obvious implementations are also contemplated by the method, such as the handling of a dexel line intersecting a same boundary face several times (e.g. due to a specific trajectory).

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for simulating machining of a workpiece with a cutting tool having at least one cutting part and at least one non-cutting part, the method comprising:
   providing to a machining simulation:
      a set of dexels that represents the workpiece, each dexel having one or more segments, the one or more segments collectively representing the intersection between a line and the workpiece,
      a trajectory of the cutting tool, the trajectory of the cutting tool being a rigid motion, and
      a set of meshes each representing a respective cutting part or non-cutting part of the cutting tool;
   and then, for each dexel in the provided set:
      computing, for each mesh, the extremity points of all polylines that describe a time of intersection between the line of the dexel and the mesh as a function of a height of intersection, according to the trajectory of the cutting tool; and
      testing a collision of the cutting tool with the workpiece along the dexel, wherein the testing includes determining if, for a value of height that corresponds to a position that belongs to a lower envelope of the set of all polylines of all meshes, the polyline to which the position belongs being associated to a non-cutting part, the value of height belongs to one of the segments of the dexel.

2. The method of claim 1, wherein computing the extremity points of all polylines comprises, for each mesh, and for each extremity point of a respective polyline:
   determining, based on all faces of the mesh associated to the respective polyline, the boundary face of a volume swept by a face of the mesh, according to the trajectory of the cutting tool, with which intersection of the line of the dexel corresponds to the extremity point; and
   computing a time and a height based on the intersection between the line of the dexel and the determined boundary face.

3. The method of claim 2, wherein computing the extremity points of all polylines further comprises, for each mesh:
   determining a visible part of the mesh, the visible part being the portion of the mesh directed toward the trajectory of the cutting tool;
   computing the boundary of a volume swept by the visible part, according to the trajectory of the cutting tool; and then
   iterating, for each extremity point of a respective polyline, the determining of the boundary face of the volume swept by a face of the mesh, with which intersection of the line of the dexel corresponds to the extremity point, and the computing of a time and a height, wherein the determining of the boundary face consists of identifying a respective boundary face of the computed boundary of the volume swept by the visible part.

4. The method of claim 3, wherein computing the extremity points of all polylines further comprises, for each mesh, determining adjacency information relative to volumes swept by the faces of the visible part, and for each respective polyline:
   the determining of the boundary face of the volume swept by a face of the mesh, with which intersection of the line of the dexel corresponds to a first extremity point of the polyline, consists of determining, by geometrical computation, a first face of the computed boundary of the volume swept by the visible part, said first face being intersected by the line of the dexel; and the determining of the boundary face of the volume swept by a face, with which intersection of the line of the dexel corresponds to the second extremity point of the polyline, consists of determining, by topological propagation based on the adjacency information, a second face of the computed boundary of the volume swept by the visible part, said second face being intersected by the line of the dexel.

5. The method of claim 4, wherein the iterating is parallelized over the set of dexels.

6. The method of claim 5, wherein the determining of first faces implements rasterization over the set of dexels.

7. The method of claim 1, further comprising:
if a collision is detected by the testing, adjusting a component of the machining simulation based on the detected collision.

8. A method for producing a product, comprising:
in a simulation phase, repeating implementation of simulating machining of a workpiece with a cutting tool having at least one cutting part and at least one non-cutting part; and
providing after the simulation phase, a machining phase on the workpiece, wherein the simulating the machining being computer-implemented and comprising:
providing:
a set of dexels that represents the workpiece, each dexel having one or more segments, the one or more segments collectively representing the intersection between a line and the workpiece,
a trajectory of the cutting tool, the trajectory of the cutting tool being a rigid motion, and
a set of meshes each representing a respective cutting part or non-cutting part of the cutting tool;
and then, for each dexel in the provided set:
computing, for each mesh, the extremity points of all polylines that describe a time of intersection between the line of the dexel and the mesh as a function of a height of intersection, according to the trajectory of the cutting tool; and
testing a collision of the cutting tool with the workpiece along the dexel, wherein the testing includes determining if, for a value of height that corresponds to a position that belongs to a lower envelope of the set of all polylines of all meshes, the polyline to which the position belongs being associated to a non-cutting part, the value of height belongs to one of the segments of the dexel.

9. The method of claim 8, further comprising:
if a collision is detected by the testing, adjusting a component of the machining simulation based on the detected collision.

10. A computer program product comprising:
a non-transitory computer readable storage medium having recorded thereon a data structure including specifications of a simulation of machining of a workpiece with a cutting tool having at least one cutting part and at least one non-cutting part; and
computer-implemented simulation instructions carried on the computer readable storage medium including instructions for:
providing to a machining simulation:
a set of dexels that represents the workpiece, each dexel having one or more segments, the one or more segments collectively representing the intersection between a line and the workpiece,
a trajectory of the cutting tool, the trajectory of the cutting tool being a rigid motion, and
a set of meshes each representing a respective cutting part or non-cutting part of the cutting tool;
and then, for each dexel in the provided set:
computing, for each mesh, the extremity points of all polylines that describe a time of intersection between the line of the dexel and the mesh as a function of a height of intersection, according to the trajectory of the cutting tool; and
testing a collision of the cutting tool with the workpiece along the dexel, wherein the testing includes determining if, for a value of height that corresponds to a position that belongs to a lower envelope of the set of all polylines of all meshes, the polyline to which the position belongs being associated to a non-cutting part, the value of height belongs to one of the segments of the dexel.

11. The computer program product of claim 10, wherein the computer readable storage medium further including instructions for:
when a collision is detected by the testing, adjusting a component of the machining simulation based on the detected collision.

12. A system comprising:
a processor coupled to a memory;
the memory having recorded thereon instructions for performing a computer-implemented simulating of machining of a workpiece with a cutting tool having at least one cutting part and at least one non-cutting part, the instructions comprising:
providing to a machining simulation:
a set of dexels that represents the workpiece, each dexel having one or more segments, the one or more segments collectively representing the intersection between a line and the workpiece,
a trajectory of the cutting tool, the trajectory of the cutting tool being a rigid motion, and
a set of meshes each representing a respective cutting part or non-cutting part of the cutting tool;
and then, for each dexel in the provided set:
computing, for each mesh, the extremity points of all polylines that describe a time of intersection between the line of the dexel and the mesh as a function of a height of intersection, according to the trajectory of the cutting tool; and
testing a collision of the cutting tool with the workpiece along the dexel, wherein the testing includes determining if, for a value of height that corresponds to a position that belongs to a lower envelope of the set of all polylines of all meshes, the polyline to which the position belongs being associated to a non-cutting part, the value of height belongs to one of the segments of the dexel.

13. The system of claim 12, wherein the processor is a Graphical Processing Unit.

14. The system of claim 12, wherein the instructions further comprising:
when a collision is detected by the testing, adjusting a component of the machining simulation based on the detected collision.

15. A non-transitory computer readable storage medium comprising:
a computer program recorded thereon and having instructions for performing a computer-implemented simulation of machining of a workpiece with a cutting tool, the cutting tool formed of at least one cutting part and at least one non-cutting part, the instructions comprising:
providing to a machining simulation:
- a set of dexels that represents the workpiece, each dexel having one or more segments, the one or more segments collectively representing the intersection between a line and the workpiece,
- a trajectory of the cutting tool, the trajectory of the cutting tool being a rigid motion, and
- a set of meshes each representing a respective cutting part or non-cutting part of the cutting tool;

and then, for each dexel in the provided set:
computing, for each mesh, the extremity points of all polylines that describe a time of intersection between the line of the dexel and the mesh as a function of a height of intersection, according to the trajectory of the cutting tool; and
testing a collision of the cutting tool with the workpiece along the dexel, wherein the testing includes determining if, for a value of height that corresponds to a position that belongs to a lower envelope of the set of all polylines of all meshes, the polyline to which the position belongs being associated to a non-cutting part, the value of height belongs to one of the segments of the dexel.

16. The non-transitory computer readable storage medium of claim 15, wherein the instructions further comprising:
when a collision is detected by the testing, adjusting a component of the machining simulation based on the detected collision.

\* \* \* \* \*